United States Patent
Yeo et al.

(10) Patent No.: US 12,089,201 B2
(45) Date of Patent: Sep. 10, 2024

(54) METHOD AND DEVICE FOR TRANSMITTING CONTROL INFORMATION FOR DISTINGUISHING USER IN WIRELESS COMMUNICATION SYSTEM

(71) Applicant: Samsung Electronics Co., Ltd., Gyeonggi-do (KR)

(72) Inventors: Jeongho Yeo, Gyeonggi-do (KR); Hyunseok Ryu, Gyeonggi-do (KR); Sungjin Park, Gyeonggi-do (KR); Jinyoung Oh, Gyeonggi-do (KR); Juho Lee, Gyeonggi-do (KR)

(73) Assignee: Samsung Electronics Co., Ltd (KR)

( * ) Notice: Subject to any disclaimer, the term of this patent is extended or adjusted under 35 U.S.C. 154(b) by 497 days.

(21) Appl. No.: 17/279,907

(22) PCT Filed: Sep. 24, 2019

(86) PCT No.: PCT/KR2019/012395
§ 371 (c)(1),
(2) Date: Mar. 25, 2021

(87) PCT Pub. No.: WO2020/067697
PCT Pub. Date: Apr. 2, 2020

(65) Prior Publication Data
US 2021/0400687 A1    Dec. 23, 2021

(30) Foreign Application Priority Data

Sep. 28, 2018 (KR) ........................ 10-2018-0116591
Aug. 16, 2019 (KR) ........................ 10-2019-0100406

(51) Int. Cl.
*H04W 72/1263*    (2023.01)
*H04L 1/00*    (2006.01)
(Continued)

(52) U.S. Cl.
CPC ....... *H04W 72/1263* (2013.01); *H04L 1/0061* (2013.01); *H04W 72/20* (2023.01); *H04W 72/23* (2023.01)

(58) Field of Classification Search
CPC . H04W 72/1263; H04W 72/20; H04W 72/23; H04L 1/0061; H04L 1/0065;
(Continued)

(56) References Cited

U.S. PATENT DOCUMENTS 9,154,922 B2   10/2015   Kim et al.
10,917,909 B2   2/2021   Golitschek Edler von Elbwart et al.
(Continued)

FOREIGN PATENT DOCUMENTS

EP    3 316 615    5/2018
KR    1020120010961    2/2012
(Continued)

OTHER PUBLICATIONS

Huawei, HiSilicon, "Discussion on SCI Contents for V2V", R1-164103, 3GPP TSG RAN WG1 Meeting #85, May 23-27, 2016, 6 pages.
(Continued)

*Primary Examiner* — Peter Chen
(74) *Attorney, Agent, or Firm* — The Farrell Law Firm, P.C.

(57) ABSTRACT

The present disclosure relates to a method of transmitting control information for identifying a user in a wireless communication system, and a method, performed by a transmitting device, of transmitting control information includes: adding cyclic redundancy check (CRC) bits to the control information; masking some of the CRC bits with at least one of an identifier of a receiving user equipment (UE) or an identifier of the transmitting device; and transmitting the control information to the receiving UE, wherein the
(Continued)

control information includes downlink control information (DCI) or sidelink control information (SCI).

11 Claims, 22 Drawing Sheets

(51) Int. Cl.
*H04W 72/20* (2023.01)
*H04W 72/23* (2023.01)

(58) Field of Classification Search
CPC ....... H04L 1/0072; H04L 1/18; H04L 1/0041;
H04L 1/0008; H04L 1/004; H04L 5/00;
H04L 5/0053; H04L 5/005; H04L 5/0044;
H03M 13/09
See application file for complete search history.

(56) References Cited

U.S. PATENT DOCUMENTS

| | | | |
|---|---|---|---|
| 2014/0153484 A1 | 6/2014 | Kim et al. | |
| 2018/0167129 A1* | 6/2018 | Aiba | H04B 7/0805 |
| 2020/0099499 A1 | 3/2020 | Yeo et al. | |
| 2020/0296765 A1 | 9/2020 | Kim et al. | |

FOREIGN PATENT DOCUMENTS

| | | |
|---|---|---|
| KR | 1020120119174 | 10/2012 |
| KR | 1020150107750 | 9/2015 |
| KR | 1020180021628 | 3/2018 |
| WO | WO 2017/155239 | 9/2017 |

OTHER PUBLICATIONS

European Search Report dated Jan. 19, 2022 issued in counterpart application No. 19864976.6-1216, 16 pages.
International Search Report dated Jan. 3, 2020 issued in counterpart application No. PCT/KR2019/012395, 19 pages.
European Search Report dated May 2, 2023 issued in counterpart application No. 19864976.6-1206, 5 pages.
LG Electronics, "Control Design for D2D Broadcast Communication", R1-142146, 3GPP TSG RAN WG1 Meeting #77, May 19-23, 2014, 7 pages.
European Search Report dated Aug. 31, 2021 Issued in counterpart application No. 19864976.6-1216, 16 pages.

* cited by examiner

METHOD AND DEVICE FOR TRANSMITTING CONTROL INFORMATION FOR DISTINGUISHING USER IN WIRELESS COMMUNICATION SYSTEM

PRIORITY

This application is a National Phase Entry of PCT International Application PCT/KR2019/012395, which was filed on Sep. 24, 2019, and claims priority to Korean Patent Applications 10-2018-0116591 and 10-2019-0100406, which were filed on Sep. 28, 2018, and Aug. 16, 2019, respectively, the entire content of each of which is incorporated herein by reference.

TECHNICAL FIELD

The present disclosure relates to a wireless communication system, and more particularly, to a method and device for transmitting and receiving control information for identifying a user in the wireless communication system.

BACKGROUND ART

Efforts have been made to develop an improved 5th generation (5G) communication system or pre-5G communication system to keep up with growing wireless data traffic demand after the commercialization of 4th generation (4G) communication systems. For this reason, the 5G or pre-5G communication system is called a beyond 4G network communication system or a post long-term evolution (LTE) system. A 5G communication system defined in the 3rd Generation Partnership Project (3GPP) is called a new radio (NR) system. Implementation of 5G communication systems in an ultra-high frequency (millimeter-wave (mm-Wave)) band (such as a 60-GHz band) is under consideration to achieve high data transfer rates. To mitigate path loss of radio waves and increase transmission distance of radio waves in an ultra-high frequency band for 5G communication systems, various technologies such as beamforming, massive multiple-input multiple-output (massive MIMO), full dimensional MIMO (FD-MIMO), array antennas, analog beamforming, and large-scale antennas are being studied and applied to NR systems. Furthermore, to improve system networks for 5G communication systems, various technologies including evolved small cells, advanced small cells, cloud radio access network (Cloud-RAN), ultra-dense networks, device to device (D2D) communication, wireless backhaul, moving networks, cooperative communication, coordinated multi-points (COMP), and interference cancellation are currently being developed. In addition, for 5G systems, advanced coding modulation (ACM) schemes such as Hybrid FSK and QAM Modulation (FQAM) and Sliding Window Superposition Coding (SWSC) and advanced access techniques such as Filter Bank Multicarrier (FBMC), non-orthogonal multiple access (NOMA), sparse code multiple access (SCMA), etc. are being developed.

Moreover, the Internet has evolved from a human-centered connection network, in which humans create and consume information, to the Internet of things (IoT) network in which dispersed components such as objects exchange information with one another to process the information. Internet of Everything (IoE) technology has emerged, in which the IoT technology is combined with, for example, technology for processing big data through connection with a cloud server. To implement the IoT, technologies such as a sensing technology, a wired/wireless communication and network infrastructure, a service interface technology, and a security technology are required, and thus, research has recently been conducted into technologies such as sensor networks for interconnecting objects, machine to machine (M2M) communication, and machine type communication (MTC). In an IoT environment, intelligent Internet technology services may be provided to create new values for human life by collecting and analyzing data obtained from interconnected objects. The IoT may be applied to various fields such as smart homes, smart buildings, smart cities, smart cars or connected cars, a smart grid, health care, smart home appliances, advanced medical services, etc., through convergence and integration between existing information technology (IT) and various industries.

Thus, various attempts are being made to apply a 5G communication system to the IoT network. For example, technologies such as sensor networks, M2M communication, MTC, etc., are implemented using 5G communication techniques such as beamforming, MIMO, array antennas, etc. The application of a cloud RAN as the above-described big data processing technology is an example of convergence between the 5G and IoT technologies.

As various services may be provided due to the aforementioned technical features and the development of mobile communication systems, a method of effectively providing such services is required.

DESCRIPTION OF EMBODIMENTS

Solution to Problem

The present disclosure relates to a method of transmitting control information for identifying a user, and a method, performed by a transmitting device, of transmitting control information includes: adding cyclic redundancy check (CRC) bits to the control information; masking some of the CRC bits with at least one of an identifier of a receiving user equipment (UE) or an identifier of the transmitting device; and transmitting the control information to the receiving UE, wherein the control information includes downlink control information (DCI) or sidelink control information (SCI).

MODE OF DISCLOSURE

Figure 1:
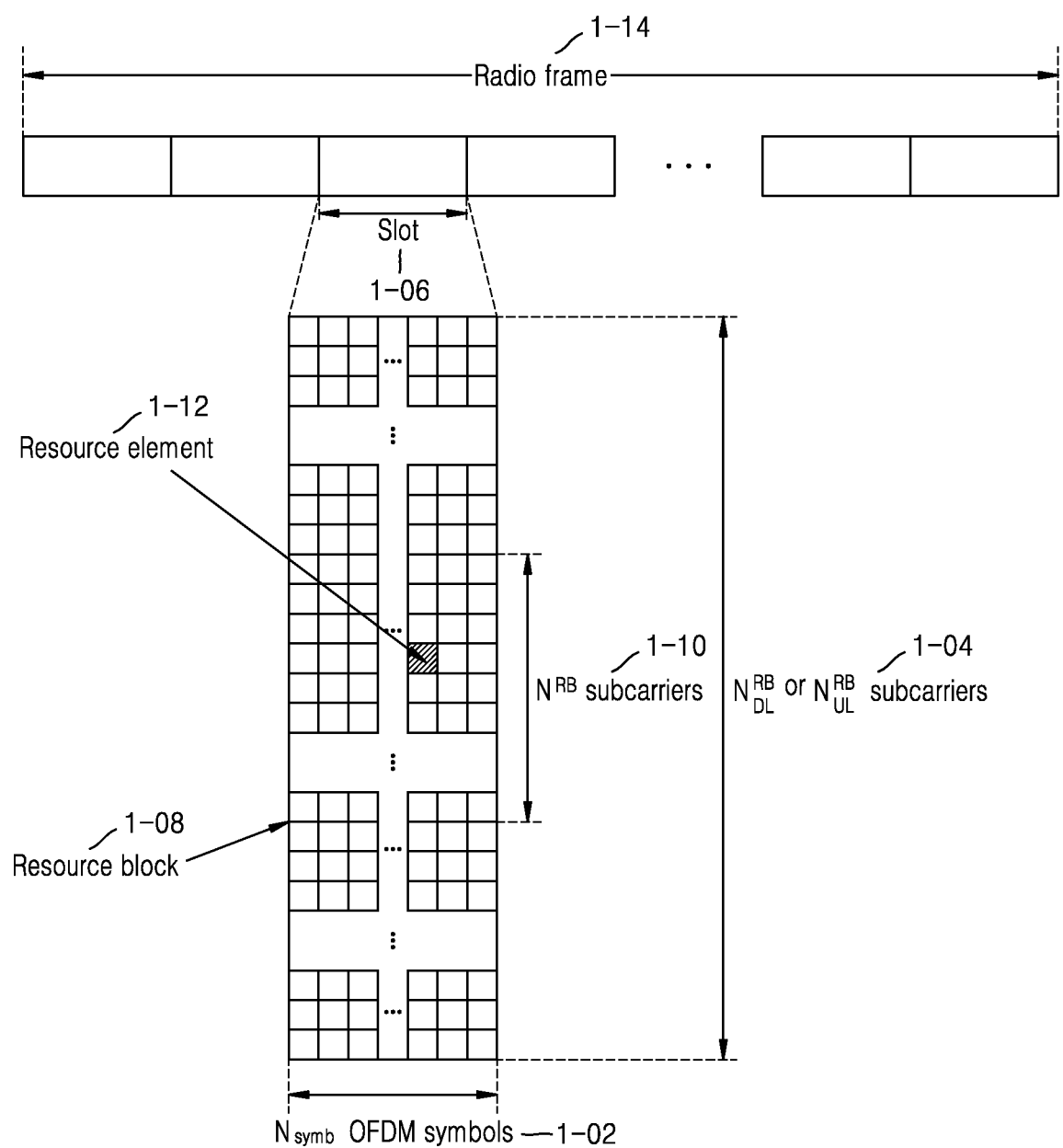
FIG. 1 illustrates a transmission structure for a time-frequency domain that is a radio resource region in a 5th generation (5G) or new radio (NR) system.

According to an embodiment of the disclosure, a method, performed by a transmitting device, of transmitting control information includes: adding cyclic redundancy check (CRC) bits to the control information; masking some of the CRC bits with at least one of an identifier of a receiving user equipment (UE) or an identifier of the transmitting device; and transmitting the control information to the receiving UE, wherein the control information includes downlink control information (DCI) or sidelink control information (SCI).

According to an embodiment of the present disclosure, a method, performed by a receiving UE, of receiving control information in a wireless communication system includes: receiving, from a transmitting device, control information appended with CRC bits; and decoding the control information, wherein some of the CRC bits are masked with at least one of an identifier of the receiving UE or an identifier of the transmitting device, and the control information includes DCI or SCI.

According to an embodiment of the present disclosure, a transmitting device for transmitting control information in a wireless communication system includes: a transceiver; and at least one processor connected to the transceiver and configured to: add CRC bits to control information; mask some of the CRC bits with at least one of an identifier of a receiving UE or an identifier of the transmitting device; and transmit the control information to the receiving UE. The control information may include DCI or SCI.

According to an embodiment of the present disclosure, a receiving UE for receiving control information in a wireless communication system includes: a transceiver; and at least one processor connected to the transceiver and configured to: receive, from a transmitting device, control information appended with CRC bits; and decode the control information, wherein some of the CRC bits are masked with at least one of an identifier of the receiving UE or an identifier of the transmitting device, and the control information includes DCI or SCI.

Hereinafter, embodiments of the present disclosure will be described in detail with reference to the accompanying drawings.

In the following description of embodiments, descriptions of technical features that are well known in the art to which the present disclosure pertains and are not directly related to the present disclosure are omitted. This is for clearly describing the essence of the present disclosure without obscuring it by omitting the unnecessary descriptions.

For the same reason, in the accompanying drawings, some components are exaggerated, omitted, or schematically illustrated. Furthermore, the size of each element does not entirely reflect an actual size thereof. In the drawings, like reference numerals refer to the same or corresponding elements throughout.

Advantages and features of the present disclosure and methods of accomplishing the same will be more readily appreciated by referring to the following description of embodiments and the accompanying drawings. However, the present disclosure may be embodied in many different forms and should not be construed as being limited to the embodiments set forth below. Rather, the embodiments are provided so that the present disclosure will be made thorough and complete and will fully convey the concept of the present disclosure to those of ordinary skill in the art to which the present disclosure pertains, and the present disclosure will only be defined by the appended claims. Throughout the specification, like reference numerals refer to like elements.

It will be understood that each block of the flowchart in the drawings and combinations of blocks of the flowchart may be performed by computer program instructions. These computer program instructions may be loaded into a processor of a general-purpose computer, special-purpose computer, or other programmable data processing equipment, and thus, the instructions performed via the processor of the computer or other programmable data processing equipment create a means for performing functions specified in the flowchart block(s). The computer program instructions may also be stored in a computer-executable or computer-readable memory capable of directing a computer or another programmable data processing apparatus to implement functions in a specific manner, and thus, the instructions stored in the computer-executable or computer-readable memory are capable of producing items including instruction means for performing the functions described in the flowchart block(s). The computer program instructions may also be loaded into a computer or another programmable data processing apparatus, and thus, instructions for operating the computer or the other programmable data processing apparatus by generating a computer-executed process when a series of operations are performed in the computer or the other programmable data processing apparatus may provide operations for performing the functions described in the flowchart block(s).

In addition, each block may represent a portion of a module, segment, or code that includes one or more executable instructions for executing specified logical function(s). It is also noted that, in some alternative implementations, functions mentioned in blocks may occur out of order. For example, two blocks illustrated in succession may be executed substantially simultaneously, or the blocks may sometimes be executed in reverse order depending on functions corresponding thereto.

As used herein, the term "unit" denotes a software element or a hardware element such as a field-programmable gate array (FPGA) or an application-specific integrated circuit (ASIC), and performs certain functions. However, the term "unit" is not limited to software or hardware. The 'unit' may be configured to be in an addressable storage medium or configured to operate one or more processors. Thus, the term 'unit' may include, for example, elements such as software elements, object-oriented software elements, class elements, and task elements, processes, functions, attributes, procedures, subroutines, segments of program code, drivers, firmware, micro-codes, circuits, data, a database, data structures, tables, arrays, and variables. Functions provided by the elements and "units" may be combined into a smaller number of elements and "units", or may be further divided into additional elements and "units". Furthermore, the elements and "units" may be embodied to reproduce one or more central processing units (CPUs) in a device or security multimedia card. In addition, in an embodiment, the "unit" may include one or more processors.

Wireless communication systems have progressed beyond providing initial voice-centered services into broadband wireless communication systems that provide high-speed, high-quality packet data services based on communication standards such as 3rd Generation Partnership Project (3GPP)'s High Speed Packet Access (HSPA), LTE or Evolved Universal Terrestrial Radio Access (E-UTRA), LTE-advanced (LTE-A), 3GPP2's High Rate Packet Data (HRPD), Ultra Mobile Broadband (UMB), and IEEE's 802.16e. Furthermore, 5th generation (5G) or new radio (NR) communication standards are being developed for 5G wireless communication systems.

As a representative example of a broadband wireless communication system, an NR system adopts an orthogonal frequency division multiplexing (OFDM) scheme for down-link (DL) and uplink (UL). However, in detail, a cyclic-prefix OFDM (CP-OFDM) scheme is used in DL while both the CP-OFDM scheme and discrete Fourier transform spreading OFDM (DFT-S-OFDM) scheme are used in UL. UL refers to a radio link through which a terminal (UE) or mobile station (MS) transmits data or a control signal to a base station (BS) (or next generation Node B (gNode B)), and DL refers to a radio link through which the BS transmits data or a control signal to the terminal. In the multiple access scheme as described above, data or control information of each user may be distinguished by allocating and operating time-frequency resources carrying the data or the control information for each user to prevent overlapping i.e., maintain orthogonality therebetween.

A 5G or NR system adopts a hybrid automatic repeat request (HARQ) method by which data is retransmitted in a physical layer when decoding of the data fails in an initial transmission. According to the HARQ method, when a receiver fails to correctly decode data, the receiver transmits a negative acknowledgement (NACK) indicating the decoding failure to a transmitter so that the transmitter may retransmit the corresponding data in the physical layer. The receiver may combine the data retransmitted by the transmitter with the data for which the decoding has failed to improve data reception performance. In addition, when the receiver succeeds in correctly decoding the data, the receiver may transmit an ACK indicating the decoding success to the transmitter so that the transmitter may transmit new data.

A system using an NR access technology, which is new 5G communication, has been designed so that various services are freely multiplexed in time and frequency resources, and accordingly, waveforms/numerology, etc., and a reference signal, etc. may be allocated dynamically or freely according to a demand of a corresponding service. To provide an optimal service to a terminal in wireless communication, optimized data transmission via measurement of channel quality and interference amount is of importance, and thus accurate measurement of a channel state is essential. However, unlike in 4th generation (4G) communication in which channel and interference characteristics do not vary significantly with frequency resources, channel and interference characteristics for a 5G or NR channel vary significantly according services, and thus it is necessary to support a subset of a frequency resource group (FRG) that allows separate measurement of channel and interference characteristics. Moreover, services supported by a 5G or NR system may be classified into several categories such as enhanced mobile broadband (eMBB), massive machine type communication (mMTC), ultra-reliable and low latency communication (URLLC), etc. An eMBB service aims at high-speed transfer of large volume of data, an mMTC service aims at providing connectivity to a large number of terminals and minimizing power consumption by a terminal, and a URLLC service aims at high reliability with low latency. Different requirements may be applied depending on types of services supported by a terminal.

Because the URLLC service among the above-described services is targeted at high reliability and low latency, control information and data information to be transmitted on a physical channel may need to be transmitted with a low coding rate. In LTE, a function of repeatedly transmitting the control information has already been introduced in MTC or Narrow Band Internet-of-Things (NB-IoT) services. The purpose of this introduction is to provide high coverage for terminals supporting a small bandwidth, so a latency is not sufficiently taken into account. Furthermore, a smallest unit of repeated transmission of control information is fixed to a unit of subframe based on LTE. In order to support URLLC services in an NR or 5G system, repetitive transmission mode for control information needs to be introduced to improve reliability while requiring low latency. Thus, in the present disclosure, a situation in which control information is repeatedly transmitted within a slot is basically taken into consideration. Additionally, a situation in which control information that can be transmitted beyond a slot boundary is repeatedly transmitted is also taken into consideration. By performing operations provided in the present disclosure, a terminal is able to detect control information transmitted by a BS in less time with a high reliability.

FIG. 1 illustrates a transmission structure for a time-frequency domain that is a radio resource region in a 5G or NR system.

Referring to FIG. 1, the abscissa represents a time domain and the ordinate represents a frequency domain. The smallest transmission unit in the time domain is an OFDM symbol, and a number of $N_{symb}$ OFDM symbols 1-02 are collected to form a slot 1-06. A length of a subframe may be defined as 1.0 ms, and a length of a radio frame 1-14 may be defined as 10 ms. The smallest transmission unit in the frequency domain is a subcarrier, and the entire system transmission bandwidth may be composed of a total of New subcarriers 1-04. However, these specific values may be applied variably according to a system.

The smallest resource unit in the time-frequency domain is a resource element (RE) 1-12 that may be represented by an OFDM symbol index and a subcarrier index. A resource block (RB) (or physical resource block (PRB)) 1-08 may be defined as $N_{symb}$ consecutive OFDM symbols 1-02 in the time domain and $N_{RB}$ consecutive subcarriers 1-10 in the frequency domain. Thus, the RB 1-08 in each slot may consist of $N_{symb} \times N_{RB}$ REs 1-12.

In general, a RB is a minimum data transmission unit. In the 5G or NR system, generally, $N_{symb}=14$ and $N_{RB}=12$, and the $N_{symb}$ and $N_{RB}$ may be proportional to a system transmission bandwidth. A data rate may increase proportionally to the number of RBs scheduled to a terminal. In a 5G or NR frequency division duplex (FDD) system where DL and UL operate in separate frequencies, a DL transmission bandwidth may be different from an UL transmission bandwidth. A channel bandwidth indicates a radio frequency (RF) bandwidth corresponding to a system transmission bandwidth. Tables 1-01 and 1-02 show a part of a corresponding relation among a system transmission bandwidth, subcarrier spacing (SCS), and a channel bandwidth, which are all defined in the 5G or NR system operating in a frequency band lower than 6 GHz and a frequency band higher than 6 GHz. For example, in a 5G or NR system supporting a channel bandwidth of 100 MHz for SCS of 30 kHz, a transmission bandwidth consists of 273 RBs. In Tables 1-01 and 1-02 below, N/A may indicate a bandwidth-subcarrier combination that is not supported by the NR system.

TABLE 1-01

| Channel bandwidth $BW_{channel}$ [MHz] | Subcarrier Spacing (SCS) | 5 | 10 | 20 | 50 | 80 | 100 |
|---|---|---|---|---|---|---|---|
| Transmission bandwidth configuration $N_{RB}$ | 15 kHz | 25 | 52 | 106 | 270 | N/A | N/A |
| | 30 kHz | 11 | 24 | 51 | 133 | 217 | 273 |
| | 60 kHz | N/A | 11 | 24 | 65 | 107 | 135 |

TABLE 1-02

| Channel bandwidth $BW_{Channel}$ [MHz] | Subcarrier Spacing (SCS) | 50 | 100 | 20 | 50 |
|---|---|---|---|---|---|
| Transmission bandwidth configuration $N_{RB}$ | 60 kHz | 66 | 132 | 264 | N/A |
| | 120 kHz | 32 | 66 | 132 | 264 |

In the 5G or NR system, scheduling information for DL or UL data may be transmitted from a BS to a terminal via DCI. Various DCI formats may be defined, and each DCI format may represent whether DCI is scheduling information (UL grant) for UL data or scheduling information (DL grant) for DL data, whether the DCI is compact DCI having a small size of control information, whether spatial multiplexing using multiple antennas is applied, whether the DCI is DCI for power control, etc. For example, DCI format 1-1 that is scheduling control information (DL grant) for DL data may include at least one of the following pieces of control information.

Carrier indicator: This indicates a frequency carrier on which transmission is performed.

DCI format indicator: This is an indicator for identifying whether a corresponding DCI is for DL or UL.

Bandwidth part (BWP) indicator: This indicates a BWP in which transmission is performed.

Frequency domain resource assignment: This indicates an RB in the frequency domain, which is allocated for data transmission. Representation of a resource is determined according to a system bandwidth and a resource assignment scheme.

Time domain resource assignment: This indicates a slot and OFDM symbols on which a data-related channel is to be transmitted.

Virtual RB (VRB)-to-PRB mapping: This indicates a mapping scheme by which a VRB index is mapped to a PRB index.

Modulation and coding scheme (MCS): This indicates a coding rate and a modulation scheme used for data transmission. In other words, MCS may indicate a coding rate value that can be used to notify a transport block size (TBS) and channel coding information together with information about whether the modulation scheme is quadrature phase shift keying (QPSK), 16 quadrature amplitude modulation (QAM), 64QAM, and 256QAM.

Codeblock group (CBG) transmission information: This indicates information about which CBG is to be transmitted when CBG retransmission is configured.

HARQ process number: This indicates the number of HARQ processes.

New data indicator (NDI): This indicates whether transmission corresponds to HARQ initial transmission or HARQ retransmission.

Redundancy version (RV): This indicates a RV of HARQ.

Transmit power control (TPC) command for a physical UL control channel (PUCCH): This indicates a TPC command for a PUCCH that is an UL control channel.

In the physical UL shared channel (PUSCH) transmission, the time domain resource assignment may be transmitted via information about a slot on which the PUSCH is transmitted, and S that is a starting symbol location in the corresponding slot, and L that is the number of symbols to which PUSCH is mapped. S may be the location of the starting symbol relative to the start of the slot, L may be the number of consecutive OFDM symbols, and S and L may be determined from a start and length indicator (SLIV) value defined as follows:

if $(L-1) \leq 7$ then $$SLIV = 14 \cdot (L-1) + S$$

else $$SLIV = 14 \cdot (14-L+1) + (14-1-S)$$

where $0 < L \leq 14-S$

In the 5G or NR system, Table including information about an SLIV value, a PUSCH mapping type, and a slot on which a PUSCH is transmitted is included in a single row may be configured generally via radio resource control (RRC). Thereafter, by indicating an index value in configured Table via the time domain resource assignment of the DCI, a BS may transmit, to a terminal, the information about the SLIV value, the PUSCH mapping type, and the slot on which the PUSCH is transmitted In the 5G or NR system, type A and type B are defined as the PUSCH mapping type. In PUSCH mapping type A, a first symbol among demodulation reference signal (DMRS) symbols is located in a second or third OFDM symbol of a slot. In PUSCH mapping type B, a first symbol among DMRS symbols is located in a first OFDM symbol of time domain resources allocated for PUSCH transmission. The PUSCH time domain resource allocation method is equally applicable to physical DL shared channel (PDSCH) time domain resource allocation The DCI may undergo channel coding and modulation and then be transmitted on physical DL control channel (PDCCH) that is a physical DL control channel (hereinafter to be used interchangeably with control information).

In general, the DCI may be scrambled by a specific radio network temporary identifier (RNTI) (or a terminal identifier) independently with respect to each terminal, may be attached with a CRC, may be channel-coded, and then may be configured as an independent PDCCH to be transmitted. The PDCCH is mapped in a control resource set (CORESET) configured for a terminal and then transmitted.

DL data may be transmitted on a PDSCH that is a physical channel for transmission of downlink data. A PDSCH may be transmitted after a control channel transmission interval, and scheduling information such as a specific mapping location in the frequency domain, a modulation scheme, etc. may be determined based on a DCI transmitted via the PDCCH.

By using MCS in control information configuring the DCI, the BS notifies the terminal of a modulation scheme applied to a PDSCH to be transmitted to the terminal and a size of data to be transmitted (TBS). According to an embodiment, the MCS may consist of five (5) bits or more or fewer bits. The TBS may correspond to a size of a TB before channel coding for error correction is applied to data (TB) to be transmitted by the BS.

In the present disclosure, a TB may include a medium access control (MAC) header, a MAC control element (CE), one or more MAC service data units (SDUs), and padding bits. Alternatively, a TB may represent a data unit or a MAC protocol data unit (PDU) provided from a MAC layer to a physical layer.

Modulation schemes supported in the 5G or NR system are QPSK, 16 QAM, 64QAM, and 256QAM for which modulation orders (quadrature modulation (Qm)) correspond to 2, 4, 6, and 8, respectively. In other words, in QPSK modulation, 2 bits per symbol may be transmitted, while in 16 QAM, 64QAM and 256QAM modulation schemes, 4, 6, and 8 bits per symbol may be transmitted, respectively.

Figure 2:
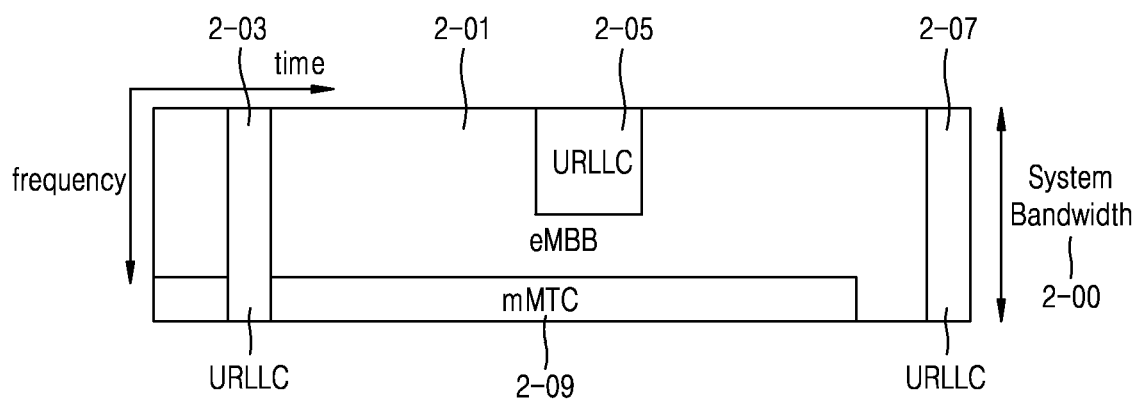
FIG. 2 illustrates an example in which frequency-time resources are allocated to enhanced mobile broadband (eMBB), ultra-reliable and low-latency communications (URLLC), and massive machine type communications (mMTC) data in a 5G or NR system.
Figure 3:
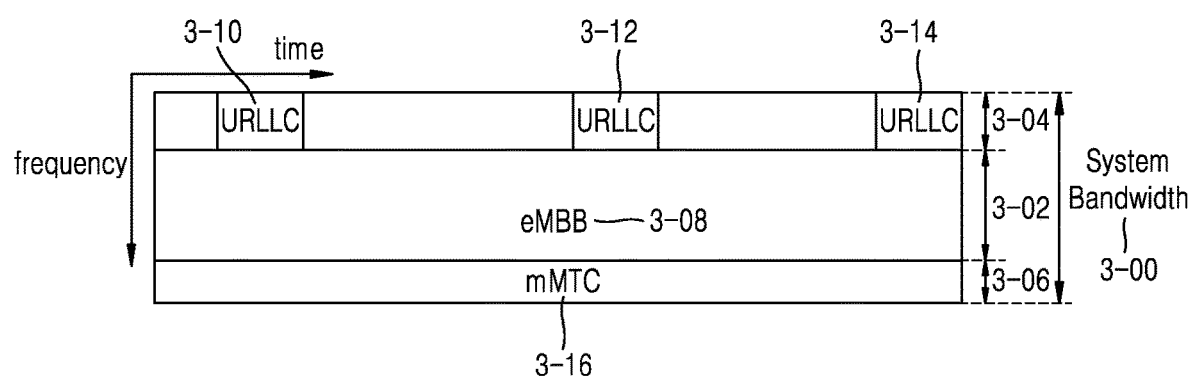
FIG. 3 illustrates an example in which time-frequency resources are allocated to eMBB, URLLC, mMTC data in a 5G or NR system.

FIGS. 2 and 3 illustrate examples in which frequency-time resources are allocated to data for eMBB, URLLC, and mMTC in a 5G or NR system.

FIGS. 2 and 3 show a scheme by which frequency and time resources are allocated for transmission of information in the 5G or NR system.

Referring to FIG. 2, resources are allocated to data for eMBB, URLLC, and mMTC across the entire system bandwidth 2-00. When pieces of URLLC data 2-03, 2-05, and 2-07 are generated and need to be transmitted while eMBB data 2-01 and mMTC data 2-09 are being transmitted after resources in particular frequency bands are allocated thereto, the pieces of URLLC data 2-03, 2-05, and 2-07 may be transmitted by emptying or without transmitting the eMBB data 2-01 and the mMTC data 2-09 to which the resources have already been allocated. Because URLLC among the services requires low latency, the pieces of URLLC data 2-03, 2-05, and 2-07 may be allocated to a part of the resource allocated to the eMBB data 2-01 and may be transmitted. When URLLC data is additionally allocated and transmitted on a resource to which eMBB data is allocated, the eMBB data may not be transmitted on the overlapping frequency-time resource, and accordingly, transmission performance of the eMBB data may be degraded. In other words, an eMBB data transmission failure due to allocation of URLLC data may occur.

Referring to FIG. 3, the entire system frequency bandwidth 3-00 is divided into subbands 3-02, 3-04, and 3-06, each of which may be used to transmit a service and data. Information related to subband configuration may be previously determined and transmitted by a BS to a terminal via higher layer signaling. Alternatively, the BS or network node may provide services by randomly dividing the system frequency bandwidth into subbands without transmitting separate subband configuration information to the terminal. FIG. 3 illustrates an embodiment in which a subband 3-02 is used to transmit eMBB data, a subband 3-04 is used to transmit pieces of URLLC data, and a subband 3-06 is used to transmit mMTC data.

In the embodiment, a length of a transmission time interval (TTI) used to transmit URLLC may be smaller than that of a TTI used to transmit eMBB or mMTC. Furthermore, a response to information related to URLLC may be transmitted faster than that of eMBB or mMTC, so that information can be transmitted and received with low latency. Structures of physical layer channels respectively used for the three types of services or data to transmit the three types of services or data may be different from one another. For example, at least one of a length of a TTI, a frequency resource allocation unit, a structure of a control channel, or a data mapping scheme may be different for each of URLLC, mMTC, and eMBB.

Although the embodiment of the present disclosure has been described with respect to three types of services and three types of data, more types of services and data corresponding thereto may be available and may also be applied to the more types of services and data.

Terms "physical channel" and "signal" may be used in a 5G or NR system to describe a method and device proposed in an embodiment of the present disclosure. Embodiments of the present disclosure are not limited to the 5G or NR system but may be applied to wireless communication systems other than the 5G or NR system.

Figure 4:
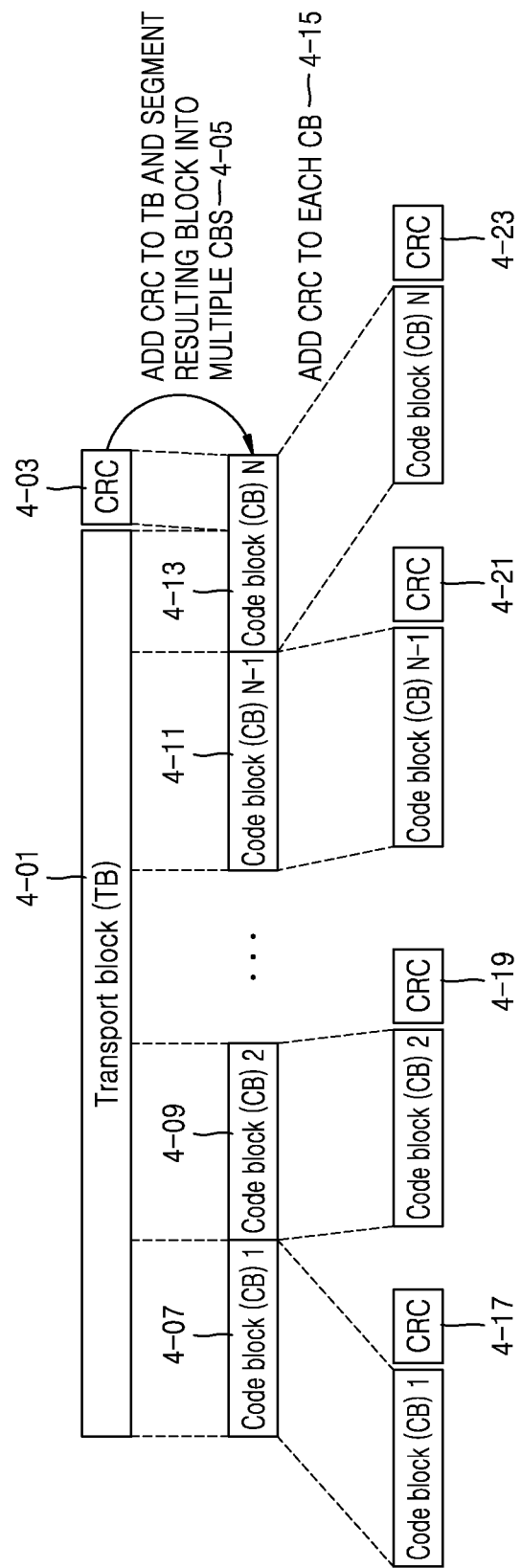
FIG. 4 illustrates a process in which one transport block is divided into multiple code blocks and a cyclic redundancy check (CRC) is added to each code block.

FIG. 4 illustrates a process in which one TB is divided into multiple code blocks (CBs) and a CRC is added to each code block.

Referring to FIG. 4, a CRC 4-03 may be added to a last or foremost part of a TB 4-01 to be transmitted in UL or DL. A CRC may have 16 bits, 24 bits, a fixed number of bits, or a variable number of bits according to a channel status, etc., and may be used to determine whether channel coding has succeeded.

A block in which the CRC 4-03 is added to the TB 4-01 may be segmented into a plurality of CBs 4-07, 4-09, 4-11, and 4-13 (operation 4-05). A maximum size of CBs may be previously determined before the CBs are obtained by segmentation, and the last CB 4-13 from among the obtained CBs may have a size smaller than those of the other CBs. Furthermore, the last CB 4-13 may be adjusted to have the same length as those of the other CBs by adding 0, a random value, or 1 to the last CB 4-13. CRCs 4-17, 4-19, 4-21, and 4-23 may be respectively added to the CBs 4-07, 4-09, 4-11, and 4-13 (operation 4-15). Each CRC may have 16 bits, 24 bits, or a fixed number of bits and may be used to determine whether channel coding has succeeded.

In order to generate the CRC 4-03, the TB 4-01 and a cyclic generator polynomial may be used, and the cyclic generator polynomial may be defined using various methods For example, when it is assumed that a cyclic generator polynomial for a 24-bit CRC is expressed as $g_{CRC24A}(D)=D^{24}+D^{23}+D^{18}+D^{17}+D^{14}+D^{11}+D^{10}+D^7+D^6+D^5+D^4+D^3+D+1$ and L=24, for TB data $a_0, a_1, a_2, a_3, \ldots,$ and $a^{A-1}$, CRC $p_0, p_1, p_2, p_3, \ldots,$ and $p_{L-1}$ may be determined as values that make zero the remainder produced when $a_0 D^{A+23}+a_1 D^{A+22}+ \ldots +a_{A-1}D^{24}+p_0 D^{23}+p_1 D^{22}+ \ldots +p_{22}D^1+p_{23}$ be 0 after $a_0 D^{A+23}+a_1 D^{A+22}+ \ldots +a_{A-1}D^{24}+p_0 D^{23}+p_1 D^{22}+ \ldots +p_{22}D^1+p_{23}$ is divided by $g_{CRC24A}(D)$. Although an example in which a length L of a CRC is 24 has been described, the length L of CRC may be determined to be any of various lengths such as 12, 16, 24, 32, 40, 48, 64, etc.

After the CRC 4-03 is added to the TB 4-01 according to the above procedure, the resulting block is then segmented into the number of N CBs 4-07, 4-09, 4-11, and 4-13. Thereafter, the CRCs 4-17, 4-19, 4-21, and 4-23 are respectively added to the CBs 4-07, 4-09, 4-11, and 4-13 (operation 4-15). A CRC that is added to a CB may be generated to have a length different from that of a CRC added to a TB or be generated by using a cyclic generator polynomial different from that used when the CRC added to the TB is generated. However, the CRC 4-03 added to the TB 4-01 and the CRCs 4-17, 4-19, 4-21, and 4-23 added to the CBs may be omitted according to a type of channel code to be applied to the CBs. For example, when a low-density parity-check (LDPC) code is applied to the CBs instead of a turbo code, the CRCs 4-17, 4-19, 4-21, and 4-23 to be inserted into the CBs may be omitted. However, even if the LDPC code is applied to CBs, the CRCs 4-17, 4-19, 4-21, and 4-23 may be added to the CBs. In addition, when a polar code is applied to a CB, a CRC may be added thereto or omitted.

As illustrated in FIG. 4, a maximum length of a CB is determined according to a type of channel coding to be applied to a TB to be transmitted, and a TB and a CRC added to the TB are segmented into CBs according to the maximum length of a CB. In a legacy LTE system, a CRC for a CB is added to the CB, data bits of the CB and the CRC are encoded with a channel code to determine coded bits, and the number of bits for rate-matching for the coded bits is determined in a predetermined manner.

Hereinafter, embodiments of the present disclosure will be described in detail with reference to the accompanying drawings. In the following descriptions of the present disclosure, related functions or configurations are not described in detail because they would obscure the present disclosure with unnecessary details. The terms set forth below are defined in consideration of functions in the present disclosure, and may be changed according to a user's or operator's intent, or practices. Thus, definitions of the terms should be made on the basis of the entire description of the present specification.

Hereinafter, a BS is an entity that allocates resources to a terminal, and may be at least one of an evolved Node B (eNB), a Node B, a BS, a radio access unit, a BS controller, or a network node. A terminal may include a UE, a MS, a cellular phone, a smart phone, a car, a transportation vehicle, a pedestrian, a road side unit (RSU), a computer, or a multimedia system capable of performing a communication function. In the present disclosure, a DL refers to a radio transmission path via which a BS transmits a signal to a UE, and an UL refers to a radio transmission path via which the UE transmits a signal to the BS. Furthermore, although embodiments of the present disclosure are hereinafter described with respect to an NR system, the embodiments of the present disclosure may be applied to other communication systems having similar technical backgrounds and channel configurations. Furthermore, those skilled in the art would appreciate that the embodiments of the present disclosure are applicable to other communication systems through partial modifications thereof not greatly departing from the scope of the present disclosure.

In the present disclosure, the conventional terms "physical channel" and "signal" may be used interchangeably with data or a control signal. For example, a PDSCH is a physical channel on which data is transmitted but may indicate data in the present disclosure.

Hereinafter, in the present disclosure, higher layer signaling is a signal transmission method by which a signal is transmitted from a BS to a UE via a physical layer DL data channel or from a UE to a BS via a physical layer UL data channel, and may also be referred to as RRC signaling or a MAC CE.

The present disclosure relates to a wireless communication system, and more particularly, to a method and device for transmitting and receiving control information for identifying a user in the wireless communication system. More specifically, the present disclosure relates to a method capable of transmitting and receiving a signal that is prioritized by setting a priority of LTE and NR vehicle-to-everything (V2X) signal transmission as in sidelink (SL) data transmission.

A wireless communication system, in particular, a UE that intends to communicate via SL for communication between UEs, may receive a control signal and a data signal from multiple UEs or transmission points. In this case, a receiving UE needs to determine a UE or transmission point from which a corresponding signal has been transmitted. Alternatively, the receiving UE may intend to receive only a signal from a specific UE or a specific transmission point from which it intends to receive the signal. Accordingly, the present disclosure provides a method and device for, when a receiving end receives a signal, identifying a transmitting UE or decoding only a signal from a specific transmitting end.

According to some embodiments of the present disclosure, when a UE having a SL signal transmission/reception function receives a signal, the UE may identify a transmitting end at the physical layer and decode only a data signal from a specific designated transmitting end and skip decoding of data from the other transmitting ends.

In the following embodiments, a method and device for performing data transmission/reception between a BS and a UE or between UEs are provided. In this case, the data transmission/reception may be a case where data is transmitted from one UE to a plurality of UEs, or where data is transmitted from one UE to another UE. Alternatively, the data transmission/reception may be a case where data is transmitted from a BS to a plurality of UEs. However, the present disclosure is not limited thereto and may be applied to various cases.

Figure 5:
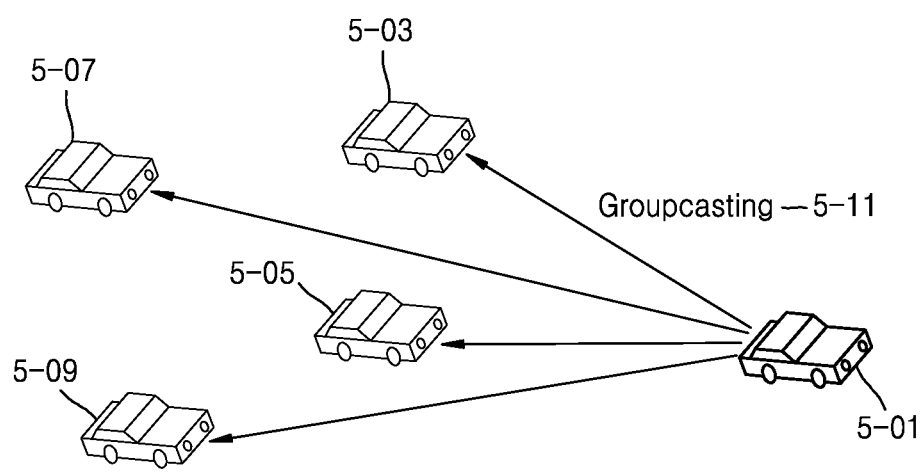
FIG. 5 illustrates an example of groupcasting in which one user equipment (UE) transmits common data to a plurality of UEs, according to some embodiments.

FIG. 5 illustrates an example of groupcasting in which one UE transmits common data to a plurality of UEs, according to some embodiments.

A UE 5-01 may be a moving UE like a vehicle. The UE 5-01 may transmit separate control information, a physical control channel, and data to a plurality of UEs 5-03, 5-05, 5-07, and 5-09 for the groupcasting.

Figure 6:
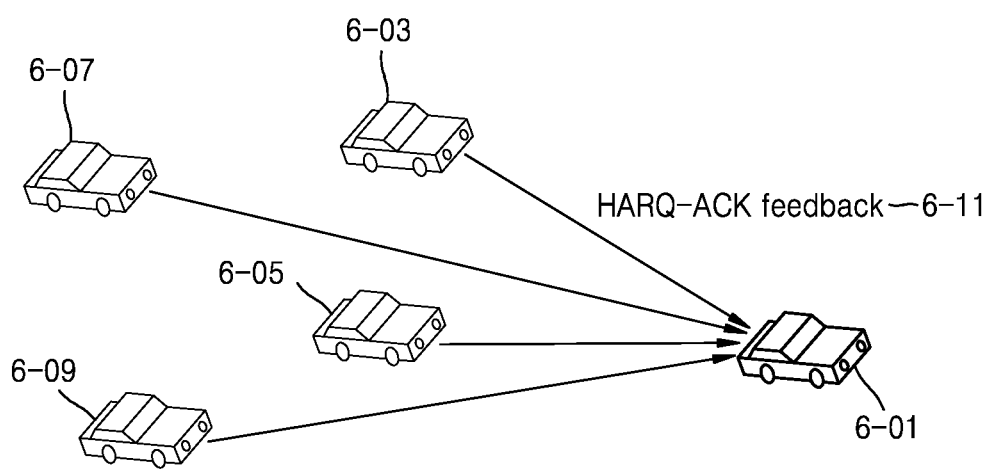
FIG. 6 illustrates a procedure in which UEs that have received common data via groupcasting transmit information related to success or failure of reception of data to a UE that has transmitted the data, according to some embodiments.

FIG. 6 illustrates a procedure in which UEs that have received common data via groupcasting transmit information related to success or failure of reception of data to a UE that has transmitted the data, according to some embodiments. Each transmitting end in groupcast may be a UE which is called a leader node or an anchor node in a group and may perform groupcast transmission for another UE in the group and perform a function of receiving control information from the other UE.

Information related to success or failure of reception of data, which is transmitted by UEs 6-03, 6-05, 6-07, and 6-09 that have received common data via groupcasting to a UE 6-01 that has transmitted the data may be information such as HARQ-ACK feedback 6-11. The UEs 6-01, 6-03, 6-05, 6-07, and 6-09 may each have an LTE- or NR-based SL function. When a UE has only an LTE-based SL function, the UE is unable to transmit or receive NR-based SL signals and physical channels. In the present disclosure, SL may be used interchangeably with PC5, V2X, or device-to-device (D²D). Although groupcasting has been described in the embodiment, the embodiment may also be applied to unicast signal transmission and reception between UEs.

In the embodiment of the present disclosure, a UE may exist in various forms such as a vehicle or a pedestrian.

Figure 7:
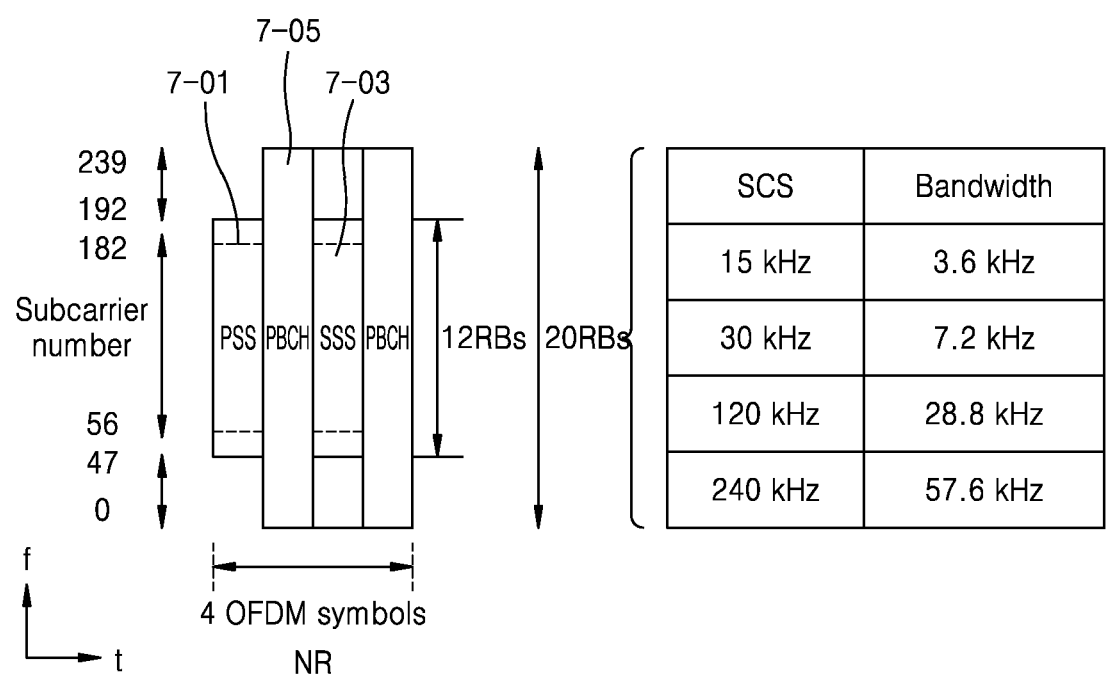
FIG. 7 illustrates an example in which synchronization signals (SSs) and a physical broadcast channel (PBCH) in a 5G or NR system are mapped in frequency and time domains, according to some embodiments.

FIG. 7 illustrates an example in which synchronization signals (SSs) and a physical broadcast channel (PBCH) in a 5G or NR system are mapped in frequency and time domains, according to some embodiments.

A primary synchronization signal (PSS) 7-01, a secondary synchronization signal (SSS) 7-03, and PBCHs 7-05 may be all mapped across 4 OFDM symbols, each of the PSS 7-01 and the SSS 7-02 may be mapped to 12 RBs, and each of the PBCHs 7-05 may be mapped to 20 RBs. A table of FIG. 7 shows how the frequency band for 20 RBs changes according to SCS. A resource region in which the PSS, SSS, and PBCH are transmitted may be called an SS/PBCH block.

Figure 8:
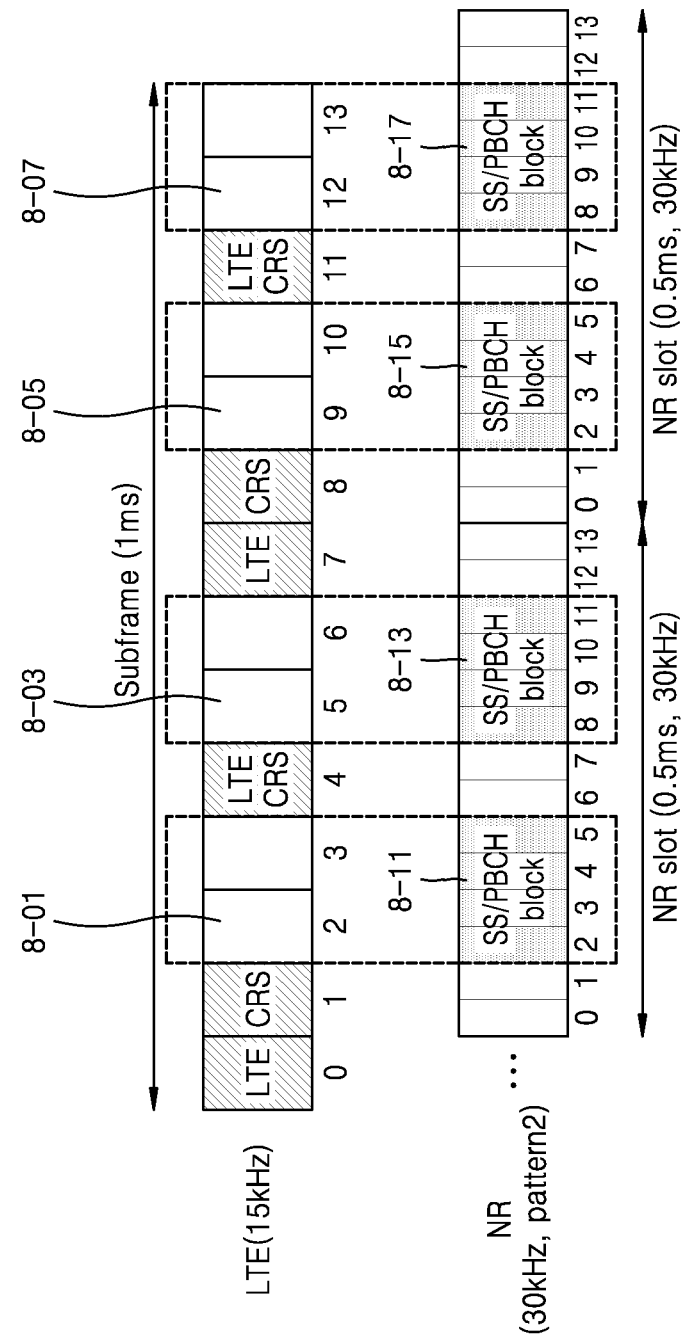
FIG. 8 is a diagram illustrating which symbols in a slot are mapped to a single SS/PBCH block, according to some embodiments.

FIG. 8 is a diagram illustrating which symbols in a slot are mapped to a single SS/PBCH block, according to some embodiments.

FIG. 8 shows an example of a legacy LTE system using SCS of 15 KHz and an NR system using SCS of 30 kHz, and the NR system may be designed so that SS/PBCH blocks 8-11, 8-13, 8-15, and 8-17 are respectively transmitted at positions at 8-01, 8-03, 8-05, and 8-07 where cell-specific reference signals (CRS) always transmitted in the LTE system can be avoided. The design may allow the LTE and NR systems to coexist in a single frequency band.

Figure 9:
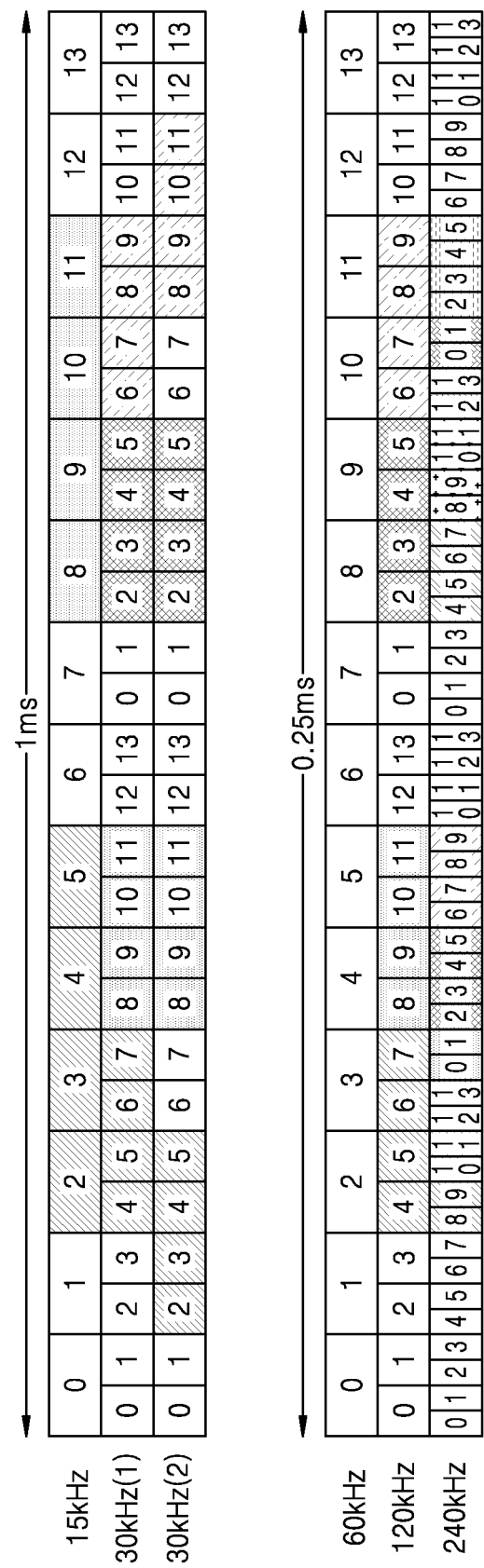
FIG. 9 is a diagram illustrating symbols in which an SS/PBCH block can be transmitted from among symbols transmitted within 1 ms, based on subcarrier spacing (SCS), according to some embodiments.
Figure 10:
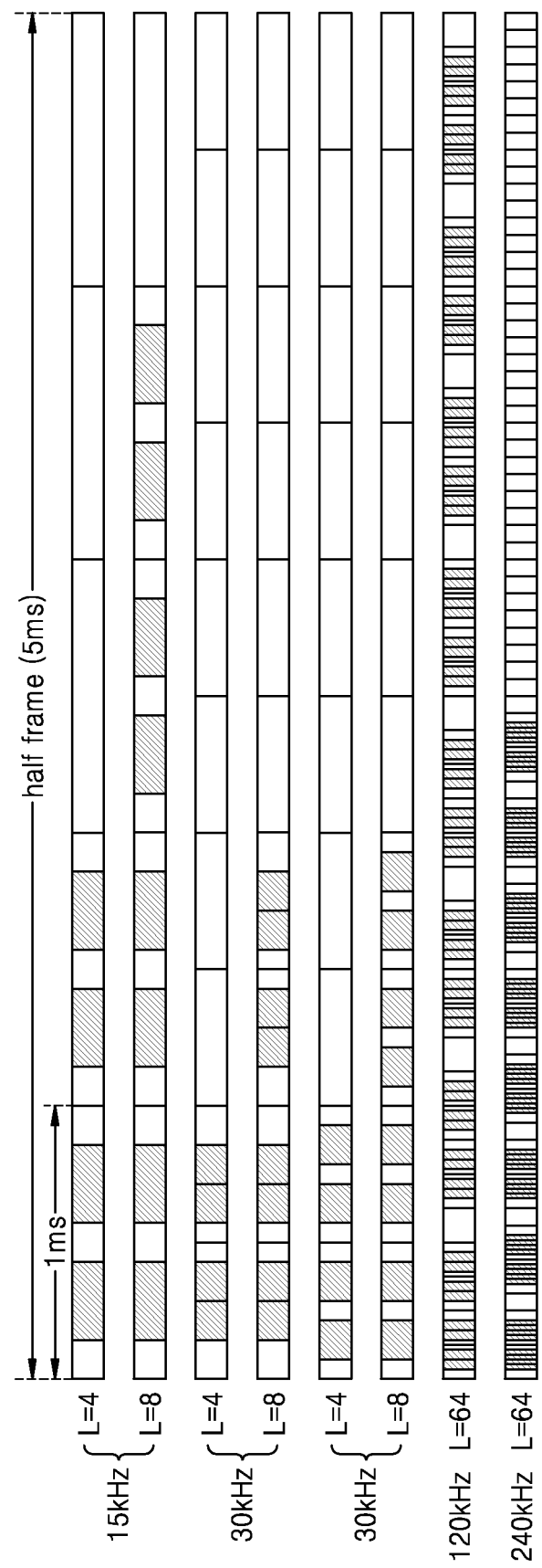
FIG. 10 is a diagram illustrating slots and symbols where an SS/PBCH block can be transmitted from among slots and symbols transmitted within 5 ms, based on SCS, according to some embodiments.

FIG. 9 is a diagram illustrating symbols in which an SS/PBCH block can be transmitted from among symbols transmitted within 1 ms, which vary depending on SCS, according to some embodiments. FIG. 10 is a diagram illustrating slots and symbols where an SS/PBCH block can be transmitted from among slots and symbols transmitted within 5 ms, which vary depending on SCS, according to some embodiments. An SS/PBCH block is not always required to be transmitted in a region where the SS/PBCH block can be transmitted as shown in FIGS. 9 and 10, and the SS/PBCH block may or may not be transmitted according to selection by a BS.

Figure 11:
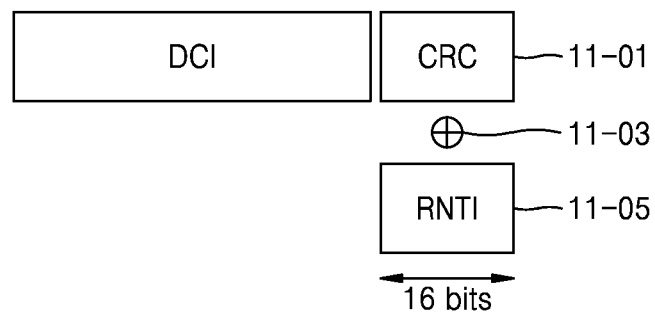
FIG. 11 illustrates an example of masking a CRC appended to downlink control information (DCI) with a radio network temporary identifier (RNTI) that is 16 bits in length in a legacy long-term evolution (LTE) system.

FIG. 11 illustrates an example of masking a CRC appended to DCI with an RNTI that is 16 bits in length in a legacy LTE system.

Referring to FIG. 11, in the legacy LTE system, an RNTI having a length of 16 bits is assigned to a UE, and a 16-bit CRC added to the control signal is masked with the assigned RNTI value for transmission of the control signal, thereby allowing the UE to identify its control signal. According to some embodiments, a 16-bit CRC is added to a last part of DCI (11-01), and a 16-bit RNTI value is added to the 16-bit CRC by using an exclusive OR (XOR) operation (11-03) (11-05). An RNTI value may be used to identify a UE or usage of a control signal. For example, the UE knows a system information RNTI (SI-RNTI) value, and the SI-RNTI value may be used to detect a control signal for transmitting system information. When RNTI is used to detect a control signal, it may be understood that when a CRC check is performed after decoding the control signal, the CRC check may be performed on a result of masking with an RNTI value again to determine whether it is successful.

Figure 12:
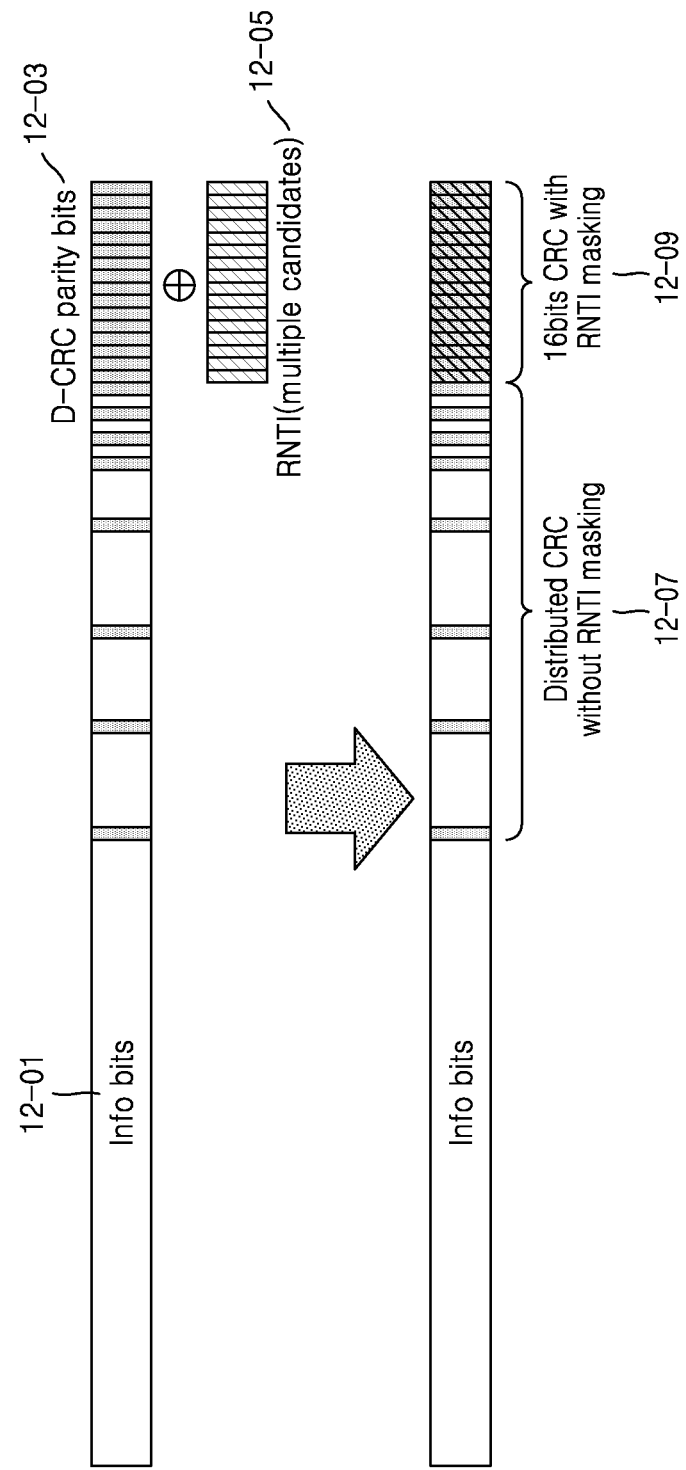
FIG. 12 illustrates an example of masking a part of CRC appended to DCI with a 16-bit RNTI in an existing NR system.

FIG. 12 illustrates an example of masking a part of CRC appended to DCI with RNTI having a length of 16 bits in an existing NR system.

Referring to FIG. 12, in the existing NR system, a 24-bit CRC 12-03 may be added to DCI information bits 12-01, and a partial CRC 12-09 may be masked with a 16-bit RNTI 12-05. According to some embodiments, the 24-bit CRC 12-03 may be added to the DCI information bits 12-01, and a partial CRC 12-07 corresponding to a part of the 24-bit CRC 12-03 may be added to the middle of the DCI information bits 12-01 while a partial CRC 12-09 corresponding to the remaining part thereof may be added to a last part of the DCI information bits 12-01. A 16-bit CRC, which corresponds to the partial CRC 12-09 between the added partial CRCs 12-07 and 12-09 and is added to the last part of the DCI information bits 12-01, may be masked with an RNTI value configured or known to a UE. Masking means performing an XOR operation on two bit values at the same position, which may be an operation that results in 0 when the two bit values are the same and results in 1 when the two bit values are different. The partial CRC 12-07 of the first 8-bits, which is added to the middle of the DCI information bits 12-01, between the added partial CRCs 12-07 and 12-09 may not be masked with a value such as RNTI. In this way, after a CRC is added to DCI information bits and a part of the CRC is masked with an RNTI, control information may undergo channel coding with polar codes and be transmitted.

According to some embodiments, after decoding the received control information using the polar codes, a receiving end may perform a CRC check by masking again the masked part of CRC added to the DCI information bits with an RNTI value known or configured to the receiving end or performing an operation for demasking the masked part of CRC, and determine whether DCI has been detected.

First Embodiment

The first embodiment of the present disclosure provides a method and device for masking a CRC added to control information with an RNTI value configured for a receiving end and a part of a group RNTI value or RNTI of a transmitting end.

Before receiving a data signal and control information for scheduling the data signal, a receiving UE may receive configuration information for data transmission from a BS or another UE at a transmitting end. The configuration information for data transmission may include a destination RNTI value indicating an ID of the receiving UE and a source RNTI value indicating an ID of a transmitting end for transmitting data. The destination RNTI value may be an RNTI value used by a UE that intends to receive data in data transmission and reception over a Uu link. In the present disclosure, data transmission and reception between a BS and a UE may be referred to as data transmission and reception through a Uu link. In addition, the control information may be DCI or SL control information (SCI). While it is assumed in the present embodiment that a destination RNTI value indicating an ID of a receiving end is 24 bits, the present embodiment may be applied when the destination RNTI value has a different number of bits.

Figure 13:
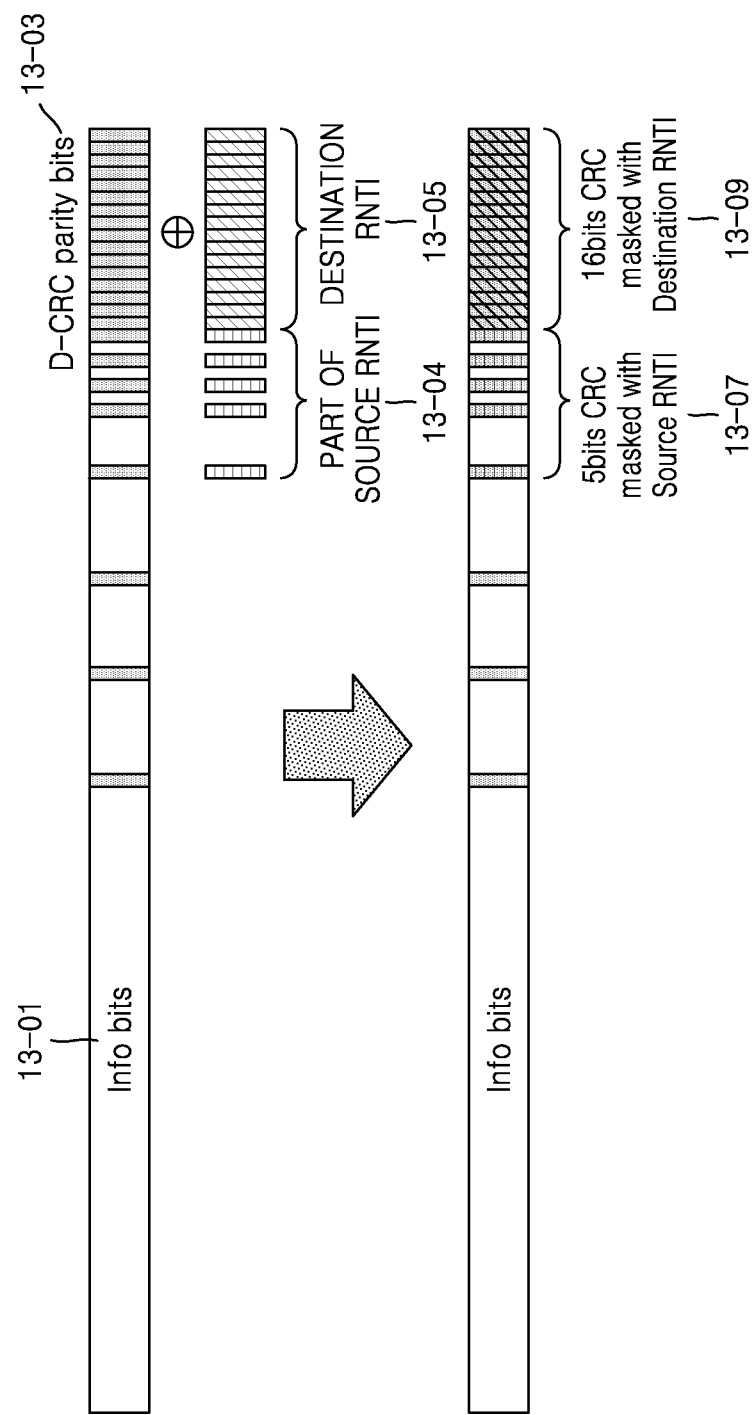
FIG. 13 illustrates an example of masking a CRC with a source RNTI and a destination RNTI, according to a first embodiment.

FIG. 13 illustrates an example of masking a CRC with a source RNTI and a destination RNTI, according to a first embodiment.

According to some embodiments, referring to FIG. 13, a 24-bit CRC 13-03 may be added to DCI or SCI information bits 13-01, a partial CRC 13-09 corresponding to a part of the 24-bit CRC 13-03 may be masked with a 16-bit destination RNTI 13-05, and a partial CRC 13-07 corresponding to the remaining part of the 24-bit CRC 13-03 may be masked with a source RNTI or 5 bits 13-04 of the source RNTI.

According to some embodiments, the 24-bit CRC 13-03 may be added to the DCI or SCI information bits 13-01, and a partial CRC corresponding to a part of the 24-bit CRC 13-03 may be added to the middle of the DCI or SCI information bits 13-01 while a partial CRC corresponding to the remaining part thereof may be added to a last part of the DCI or SCI information bits 13-01. The partial CRC 13-09, which corresponds to the last 16 bits of the added 24-bit CRC 13-03, may be masked with a destination RNTI value configured or known to a UE. Masking means performing an XOR operation on two bit values at the same position, which may be an operation that results in 0 when the two bit values are the same and results in 1 when the two bit values are different.

According to some embodiments, some of the first 8 bits of the 24-bit CRC 13-03 added to the DCI or SCI information bits 13-01, e.g., a total of 5 bits that are the fourth through eighth bits of the first 8 bits of the added 24-bit CRC 13-03, may be masked with a part of an ID of a transmitting end for transmitting a signal that a UE intends to receive or 5 bits of a source RNTI value configured for the UE together with the ID. In this case, the source RNTI value may be a total of 16 bits, and some of the first 8 bits of the added 24-bit CRC 13-03 may be masked with 5 most significant bits (MSBs) of the 16-bit source RNTI. Alternatively, some of the first 8 bits of the added 24-bit CRC 13-03 may be masked with 5 least significant bits (LSBs) of the 16-bit source RNTI. In the above description, MSBs may mean bit values from the front bits, and LSBs may mean bit values from the rearmost bits.

According to some embodiments, the first 3 bits of the 24-bit CRC 13-03 may not be masked with a value such as RNTI. When transmitting control information to a receiving end, a BS or transmitting UE may mask 5 bits of the CRC with a part of the source RNTI which is its own ID while masking the other 16 bits of the CRC with the destination RNTI value which is an ID of the receiving end.

As described above, after being attached with a CRC and then masked with a destination RNTI or a part of source RNTI, control information may undergo channel coding with polar codes and be transmitted. After decoding the control information using the polar codes, a receiving end may perform a CRC check by masking again the masked part of CRC added to the control information with the destination RNTI value and source RNTI value known or configured to the receiving end or performing an operation for demasking the masked part of CRC, and determine whether DCI has been detected.

The positions of CRC bits masked with the source RNTI and the destination RNTI provided in the present embodiment are not limited to the above-described example, and the positions thereof may be changed and applied.

Second Embodiment

The second embodiment of the present disclosure provides a method and device for transmitting and receiving control information by masking a CRC for control information with a part of ID information of a receiving end and including the remaining part of the ID information in a bit field of the control information. The control information may be DCI or SCI. While it is assumed in the present embodiment that ID information of a receiving end is 24 bits, the present embodiment may be applied when the ID information has a different number of bits. An ID of the receiving end may be a concept such as a Layer 2 (L2) ID or service ID used in an LTE-V2X system, and may be a unique ID value of a UE. Alternatively, the ID of the receiving end may be interchangeably referred to as a destination RNTI. In any concept, the ID of the receiving end may be a value used to identify the receiving end.

A 24-bit CRC may be added to control information before a channel code is applied thereto, and the last 21 bits of the 24-bit CRC may be added by masking it with the last 21 bits of a destination RNTI. Alternatively, the last 21 bits of the 24-bit CRC may be added by masking it with 21 front bits of a destination RNTI. Thereafter, the remaining 3 bits of the destination RNTI may be included in a bit field of the control information.

Figure 14:
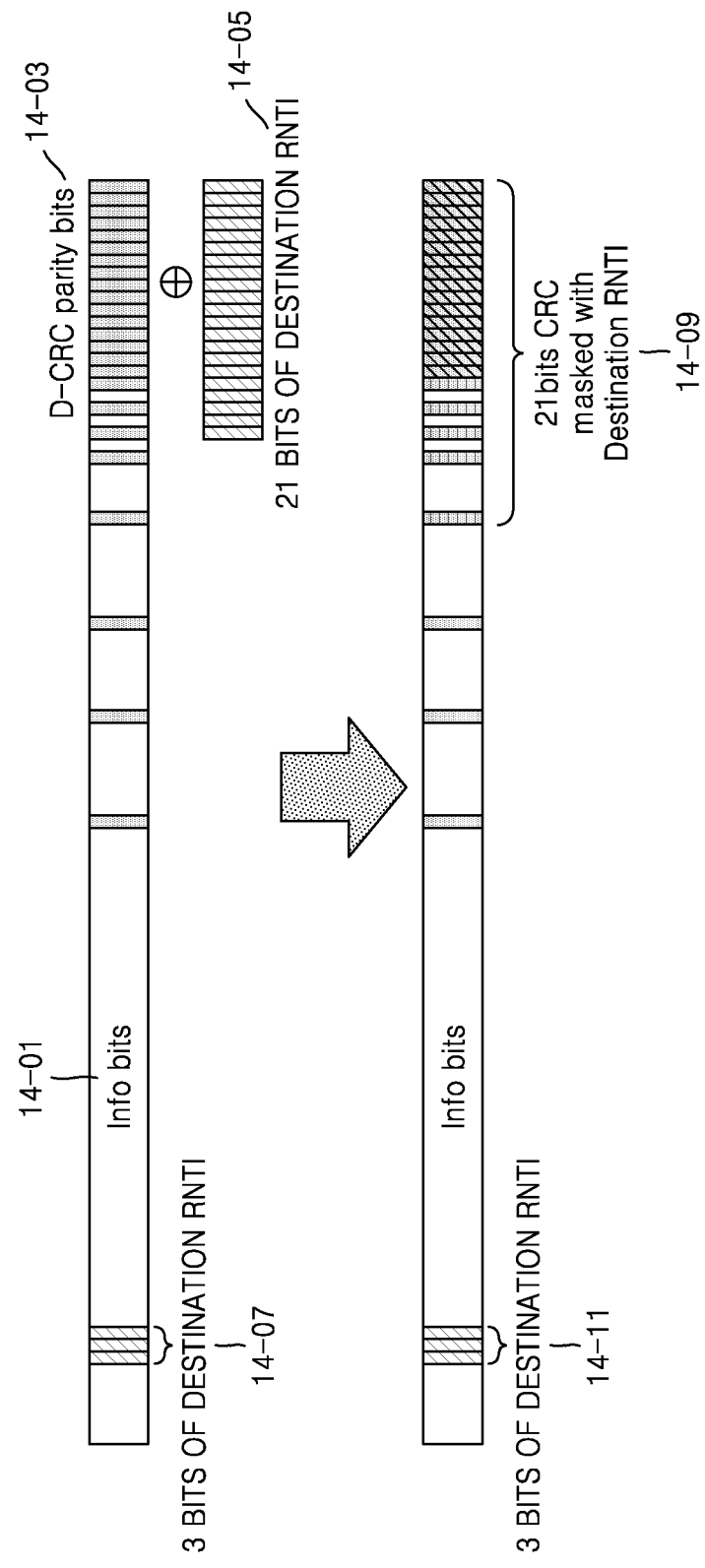
FIG. 14 illustrates an example in which a CRC is masked with a part of a destination RNTI and the remaining part of the destination RNTI is included in control information, according to a second embodiment.

FIG. 14 illustrates an example in which a CRC is masked with a part of a destination RNTI and the remaining part of the destination RNTI is included in control information, according to a second embodiment.

According to some embodiments, referring to FIG. 14, a 24-bit CRC 14-03 may be added to DCI or SCI information bits 14-01, a partial CRC 14-09 corresponding to a part of the 24-bit CRC 14-03 may be masked with 21 bits 14-05 of a 24-bit destination RNTI, and the remaining 3 bits of the 24-bit destination RNTI may be included in a bit field of control information.

According to some embodiments, the partial CRC 14-09 that is the last 21 bits of the added 24-bit CRC 14-03 may be masked with the last 21 bits 14-05 of the 24-bit destination RNTI which is information about a data-receiving side. Alternatively, the last 21 bits 14-09 of the added 24-bit CRC 14-03 may be masked with the first 21 bits 14-05 of the destination RNTI which is information about the data-receiving side. Masking means performing an XOR operation on two bit values at the same position, which may be an operation that results in 0 when the two bit values are the same and results in 1 when the two bit values are different.

According to some embodiments, masking may not be performed on the first 3 bits of the added 24-bit CRC 14-03 so that a UE may use the first 3 bits of the 24-bit CRC 14-03 for early termination of a control information decoding process. In other words, while performing the control information decoding, the UE may more quickly determine that the decoding has failed by using the first 3 bits of the CRC.

As described above, 3 bits of a destination RNTI may be added to a bit field of control information, a CRC may be added to the control information, masked with the remaining 21 bits of the destination RNTI, and then channel coding may be performed on the channel information by using polar codes for transmission. After decoding the control information using the polar codes, a receiving end may perform a CRC check by masking again the masked part of CRC added to the control information with a destination RNTI value known or configured to the receiving end or performing an operation for demasking the masked part of CRC and determine whether the control information has been correctly detected by checking the remaining 3 bits of the destination RNTI in a bit field.

The method provided according to the above-described second embodiment may be used for transmission and reception of SCI as well as transmission and reception of Uu link control information. Furthermore, according to some embodiments, while the method provided in the above-described second embodiment may be used in transmission and reception of SCI, a method of masking only the last 16 bits of CRC for control information according to the method provided in the first embodiment may be used in transmission and reception of Uu link control information, and in this case, a method of masking or demasking the CRC for the control information with a destination ID or RNTI may be determined differently according to whether a BS and a UE transmit and receive SCI or Uu link control information therebetween.

Embodiment 2-1

Embodiment 2-1 of the present disclosure provides methods that are used differently when applying the first or second embodiment of the present disclosure, depending on whether control information and data currently being transmitted and data is for unicast, groupcast, or broadcast. Furthermore, embodiment 2-1 of the present disclosure provides methods that are used differently when applying the second embodiment of the present disclosure, depending on whether data currently being transmitted requires HARQ feedback and needs to be retransmitted. Embodiment 2-1 of the present disclosure may include Method 1, Method 2, or Method 3 as follows.

Method 1: When data to be transmitted/received is for broadcast, a destination RNTI value may be included in a MAC CE, and may be included in a bit field of control information or may not be masked onto a CRC. When the data to be transmitted/received is for unicast or groupcast, the method described in the first or second embodiment may be applied. In other words, when the data to be transmitted/received is for unicast or groupcast, a method of masking a CRC for control information with a destination RNTI value may be applied. In this case, when the data to be transmitted/received is for groupcast, the destination RNTI may be a group ID value.

Method 2: When data to be transmitted/received is for broadcast, a destination RNTI value may be included in a MAC CE, and may be included in a bit field of control information or may not be masked onto a CRC. When the data to be transmitted/received is for unicast, the method described in the second embodiment may be applied. When the data to be transmitted/received is for groupcast, the method described in the first embodiment or a method of masking a CRC with 16 bits of a destination RNTI as in an existing NR system may be applied. In this case, when the data to be transmitted/received is for groupcast, the destination RNTI may be a group ID value.

Method 3: When data to be transmitted/received is for broadcast, a destination RNTI value may be included in a MAC CE, or may be included in a bit field of control information or may not be masked onto a CRC. When the data to be transmitted/received is for unicast, the method described in the first or second embodiment may be applied. When the data to be transmitted/received is for groupcast, and HARQ feedback and HARQ retransmission are performed, the method described in the first or second embodiment may be applied. When the data to be transmitted/received is for groupcast, and HARQ feedback and HARQ retransmission are not performed, the destination RNTI value may be included in the MAC CE, and may be included in the bit field of control information or may not be masked onto the CRC.

Third Embodiment

The third embodiment of the present disclosure provides a method and device for transmitting and receiving control information by masking a CRC for control information with a part of ID information of a receiving end and including the remaining part thereof in a MAC CE. The control information may be DCI or SCI. While it is assumed in the present embodiment that ID information of a receiving end is 24 bits, the present embodiment may be applied when the ID information has a different number of bits. An ID of the receiving end may be a concept such as an L2 ID or service ID used in an LTE-V2X system, and may be a unique ID value of a UE. Alternatively, the ID of the receiving end may be interchangeably referred to as a destination RNTI. In any concept, the ID of the receiving end may be a value used to identify the receiving end.

A 24-bit CRC may be added to control information before a channel code is applied thereto, wherein the last 21 bits of the 24-bit CRC may be masked with the last 21 bits of a destination RNTI and added. Alternatively, the last 21 bits of the 24-bit CRC may be masked with 21 front bits of a destination RNTI and added. Thereafter, the remaining 3 bits of the destination RNTI may be included in the MAC CE for data scheduled via the control information and transmitted to the receiving end.

Fourth Embodiment

The fourth embodiment of the present disclosure provides a method of determining a reference signal based on a source ID or a destination ID when generating a sequence for producing a demodulation reference signal (DMRS) for demodulating a physical layer control channel on which a control signal is transmitted.

A reference signal in an I-th OFDM symbol may be determined as n(m) below:

$$r_i(m) = \frac{1}{\sqrt{2}}(1 - 2 \cdot c(2m)) + j\frac{1}{\sqrt{2}}(1 - 2 \cdot c(2m + 1))$$

In n(m), pseudo-random sequence c(i) may be defined as $$c(n)=(x_1(n+N_c)+x_2(n+N_c)) \bmod 2$$

$$x_1(n+31)=(x_1(n+3)+x_1(n)) \bmod 2$$

$$x_2(n+31)=(x_2(n+3)+x_2(n+2)+x_2(n+1)+x_2(n)) \bmod 2,$$

and a sequence initialization value $c_{init}$ may be determined as follows:

$$c_{init}=(2^{17}(N_{symb}^{slot}n_{s,f}^{\mu}+l+1)(2N_{ID}+1)+2N_{ID}) \bmod 2^{31}$$

In the above equations, $N_c=1600$, $x_1(n)$ may be determined based on $x_1(0)=1$, $x_1(n)=0$, and $n=1, 2, \ldots, 30$, and $x_2(n)$ that is an m-sequence may be determined based on a relationship equation $$c_{init} = \sum_{i=0}^{30} x_2(i) \cdot 2^i.$$

$n_{s,f}^{\mu}$ is a slot number in a frame (i.e., 10 ms), and l is an OFDM symbol number within a slot.

$N_{ID}$ required to determine the sequence initialization value $c_{init}$ may be determined based on a destination ID. For example, Nip may be a value indicated by 16 MSBs of the destination ID. Thus, in a case where a UE receives data via SL, the UE may determine information about a transmitted DMRS sequence based on a UE's ID when performing channel estimation based on a DMRS to receive a control channel including control information or SCI in the SL.

Furthermore, $N_{ID}$ required to determine the sequence initialization value $c_{init}$ may be determined based on a source ID. For example, the $N_{ID}$ may be a value indicated by 16 MSBs of the source ID. Thus, in a case where the UE receives data via SL, the UE may know information about a transmitted DMRS sequence based on a source ID value of a transmitting end from which it intends to receive data when performing channel estimation based on a DMRS to receive a control channel including control information or SCI in the SL.

Fifth Embodiment

The fifth embodiment of the present disclosure provides a method of determining a reference signal based on a source ID or a destination ID when a sequence for scrambling a physical layer control channel on which a control signal is transmitted.

Data bits before a UE or BS encodes into and maps to control signals are denoted by $b(0), \ldots, b(M_{bit}-1)$, and $M_{bit}$ is the number of bits of a control channel to be transmitted. Scrambling of the bits b(n) with sequence c(n) may be performed using an equation below:

$$\tilde{b}(i)=(b(i)+c(i)) \bmod 2$$

In the above equation, pseudo-random c(i) may be defined as $$c(n)=(x_1(n+N_c)+x_2(n+N_c)) \bmod 2$$

$$x_1(n+31)=(x_1(n+3)+x_1(n)) \bmod 2$$

$$x_2(n+31)=(x_2(n+3)+x_2(n+2)+x_2(n+1)+x_2(n)) \bmod 2.$$

According to some embodiments, a sequence initialization value $c_{init}$ may be determined as follows:

$$c_{init}=(n_{RNTI}2^{24}+n_{ID}) \bmod 2^{31}$$

In the above equations, $N_c=1600$, $x_1(n)$ may be determined based on $x_1(0)=1$, $x_1(n)=0$, and $n=1, 2, \ldots, 30$, and $x_2(n)$ that is an m-sequence may be determined based on a relationship equation $$c_{init} = \sum_{i=0}^{30} x_2(i) \cdot 2^i.$$

In the present disclosure, x mod y may be a remainder of dividing x by y. In the above equation, $n_{RNTI}$ may be a value determined based on a part of a destination ID, and nip may be a value determined based on a part of a source ID or the entire source ID.

In addition, according to some embodiments, the initialization value $c_{init}$ may be determined as follows:

$$c_{init}=n_{RNTI}$$

In addition, according to some embodiments, the initialization value $c_{init}$ may be determined as follows:

$$c_{init}=(n_{RNTI}2^{24}+n_{ID}) \bmod 2^{31}$$

In the above equations, $n_{RNTI}$ may represent a destination ID value, and $n_{ID}$ may be a value determined based on a part of a source ID or the entire source ID.

The initialization value $c_{init}$ may be determined based on destination ID information by using equations for determining the initialization value $c_{init}$ according to the embodiments.

Sixth Embodiment

The sixth embodiment of the present disclosure provides an operation method of a receiving UE when the receiving UE receives control information via SL.

According to some embodiments, control information may be divided into two SCIs and transmitted to the receiving UE via SL. A method of dividing control information into two SCIs and transmitting the two SCIs may be referred to as a 2-stage (or 2-step) control information transmission method or a 2-stage (or 2-step) SCI transmission method. In the 2-stage control information transmission method for SL communication, first control information transmitted to the receiving UE may be referred to as first control information or SCI_1, and second control information may be referred to as second control information or SCI_2. When one UE performs SL communication, in all cases, both the first control information and the second control information may not be decoded to decode data, and in some cases, data scheduled by the first control information may be decoded simply by decoding the first control information.

Figure 15:
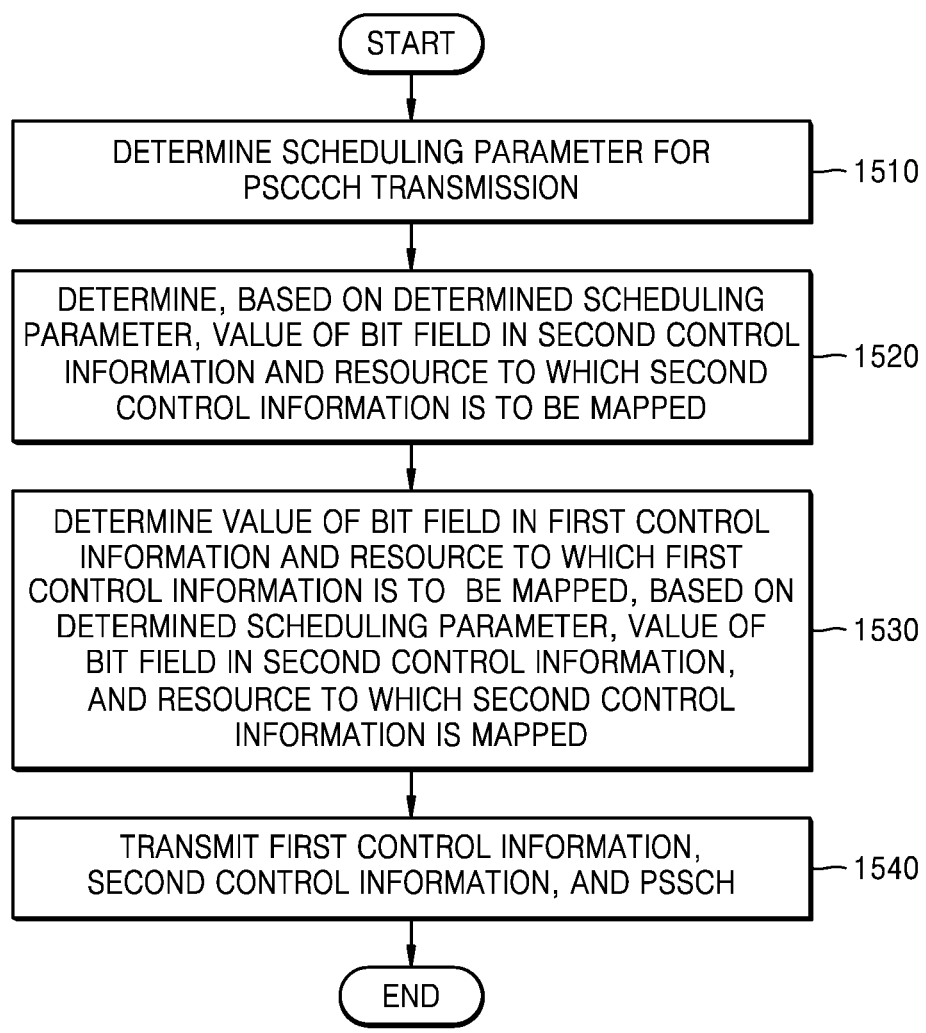
FIG. 15 is a flowchart of a method of determining, by a transmitting UE, values of bit fields in first control information and second control information, according to some embodiments.

FIG. 15 is a flowchart of a method of determining, by a transmitting UE, values of bit fields in first control information and second control information, according to some embodiments.

Referring to FIG. 15, in operation 1510, a transmitting UE may determine a resource for transmitting a physical SL shared channel (PSSCH) by using the above-described channel occupancy and channel reservation methods. The transmitting UE may determine a scheduling parameter to be included in a SCI based on the determined resource. The scheduling parameter may include frequency and time resources of the PSSCH, an MCS, a RV, an NDI, an HARQ process ID, etc.

In operation 1520, the transmitting UE may determine a value of a bit field in the second control information based on the determined scheduling parameter and determine a transmission resource to which the second control information is to be mapped.

In operation 1530, the transmitting UE may determine a value of a bit field in the first control information and a transmission resource to which the first control information is to be mapped, based on the scheduling parameter of the PSSCH, the value of the bit field in the second control information, and the transmission resource to which the second control information is mapped. This is because the first control information may include information necessary for a receiving UE to decode the second control information.

In operation 1540, the transmitting UE may transmit the first control information, the second control information, and the PSSCH based on the determined pieces of information.

FIG. 15 may be an example in which the resource to which the second control information is to be mapped is determined based on the first control information. When the resource to which the second control information is to be mapped is determined based on the first control information, it may be understood that, when the second control information is transmitted after undergoing channel coding, a receiving UE is able to identify (or determine) how much parity information is transmitted via the second control information or to identify (or determine) an actual code rate used when the second control information is transmitted. The actual code rate may be determined based on the amount of resources used for actual transmission, a modulation order, the number of bits in the second control information, etc. However, the present disclosure is not limited to the above-described embodiment, and the resource to which the second control information is to be mapped may be determined not based on the first control information but as a pre-configured value. For example, the amount of resources to which the second control information is to be mapped, the modulation order, the number of bits, etc. may be pre-configured or be determined based on information configured by a BS or another UE for transmission.

Figure 16:
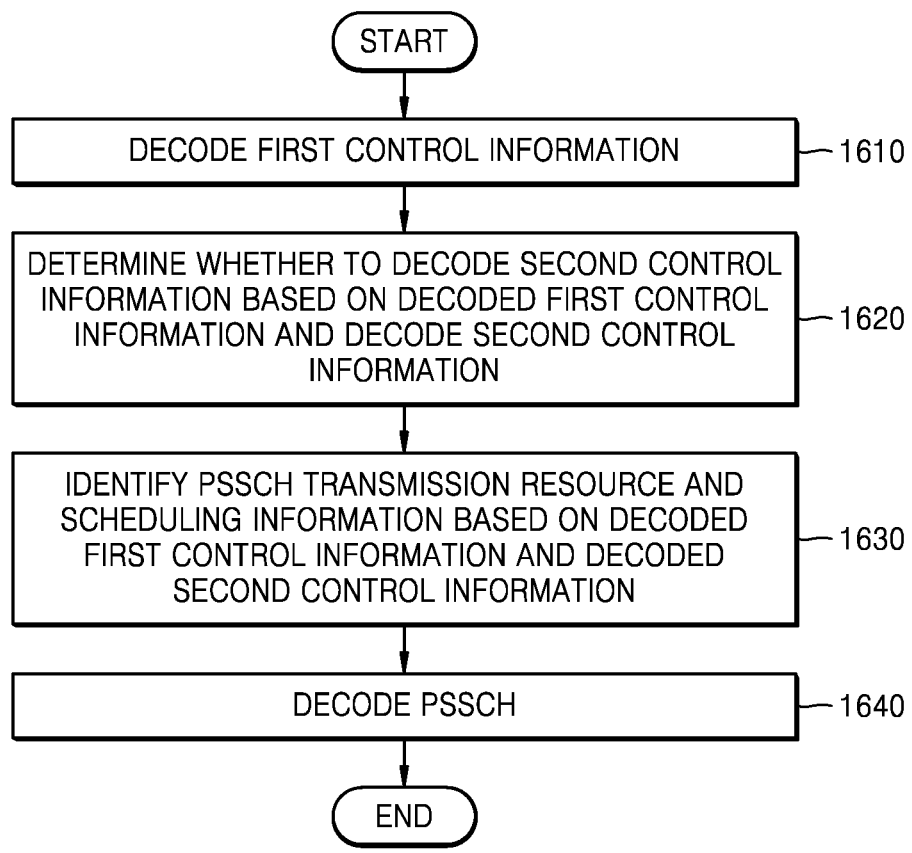
FIG. 16 is a flowchart of a method, performed by a receiving UE, of sequentially decoding first control information and second control information and decoding a physical sidelink shared channel (PSSCH) based on a result of the sequential decoding, according to some embodiments.

FIG. 16 is a flowchart of a method, performed by a receiving UE, of sequentially decoding first control information and second control information and decoding a PSSCH based on a result of the sequential decoding, according to some embodiments.

In operation 1610, the receiving UE may decode first control information based on pre-configured information or the like.

In operation 1620, the receiving UE may determine whether to decode second control information according to a value of a bit field in the decoded first control information. When the receiving UE determines that decoding of the second control information is required, the receiving UE may determine a resource to which the second control information is mapped and decode the second control information. Because a PSSCH may be decoded simply by decoding the first control information in a certain transmission type or mode, the receiving UE may determine whether to decode the second control information according to whether the PSSCH is to be decoded only by decoding the first control information.

In operation 1630, the receiving UE may identify (or determine) a PSSCH transmission resource and other scheduling information based on values of bit fields in the decoded first control information and second control information.

In operation 1640, the receiving UE may decode the PSSCH by using the identified scheduling information and perform necessary subsequent operations.

According to some embodiments, SCI formats used for transmission of the first control information and the second control information may be different from each other. For example, SCI format 1 or the like may be used for the first control information, and SCI format 2 or the like may be used for the second control information.

As described above with reference to FIG. 16, the first control information may be required to decode the second control information. Thus, when the first control information is not correctly decoded, decoding of the second control information may not also be possible. Accordingly, when a receiving UE has not decoded the second control information, it may be understood that the first control information and the second control information have not been transmitted to the receiving UE, the receiving UE has not successfully decoded the first control information, or the first control information has been successfully decoded while the second control information has not been successfully decoded. For transmission of a control signal or a control channel in which only the first control information is transmitted, decoding of the second control information may not be required.

When the UE performs decoding on the first control information and needs to receive the second control information according to the content of the first control information, information about a transmitting UE's ID may be determined based on the second control information, and information about a receiving UE's ID may be determined based on the first control information. For example, when the UE checks the content of the first control information by performing decoding on the first control information to find that the first control information includes information about decoding of the second control information, the UE may perform decoding on the second control information. This may be a method used in unicast or groupcast transmission. The case where the UE needs to receive the second control information may mean a case where the UE fails to check all scheduling information needed for data decoding from the first control information or a case where the UE receives an indication via the first control information that the second control information needs to be decoded.

When the UE performs decoding on the first control information and does not need to receive the second control information according to the content of the first control information, information about the transmitting UE's ID and receiving UE's ID may be determined based on the first control information and a MAC CE transmitted in a PSSCH. For example, when the UE checks the content of the first control information by performing decoding on the first control information to find that the first control information does not include information about decoding of the second control information, the UE may not perform decoding on the second control information. This may be a method used in broadcast transmission that is different from unicast or groupcast transmission. The case where the UE does not need to receive the second control information may mean a case where the UE checks all scheduling information needed for data decoding from the first control information or a case where the UE receives an indication via the first control information that the second control information does not need to be decoded.

Seventh Embodiment

The seventh embodiment of the present disclosure provides a method and device for determining a SL resource in an operation of UEs transmitting and receiving signals via SL. Information indicating that a specific time resource (e.g., a specific OFDM symbol or time period) may be used for SL may be information for identifying a user (or a UE) of a signal transmitted in the corresponding SL resource. For this purpose, it is necessary to know a communication link for which the corresponding time resource is used.

A BS may transmit (allocate) to a UE time resources that may be used for DL or D, UL or U, Flexible (F), and SL or S by using various methods. For example, one of the following methods or one or more thereof may be used in combination. In the present disclosure, DL may refer to a link through which a signal is transmitted from a BS to a UE. In the present disclosure, UL may refer to a link through which a signal is transmitted from a UE to a BS.

Method 1: Configuration/indication in system broadcasting information (system information block (SIB))

Method 2: Configuration/indication using higher layer signaling. For example, it may be configured via RRC signaling.

Method 3: Configuring or indicating to one or more UEs via a common channel or signal in physical layer signaling. For example, a link for which each of symbols is used may be indicated via a slot format indicator (SFI) or DCI transmitted in group common.

Method 4: Configuration/indication via physical layer signaling or physical channel for one UE. For example, a link for which symbols are used may be indicated via information transmitted using DCI for scheduling.

Method 5: Applying to the UE via pre-configured configuration information.

Method 6: Applying via PC5-RRC configuration information which is information about higher layer signaling between UEs.

Method 7: Configuration/indication via higher-layer signaling that is transmitted from a UE. For example, a specific UE may transmit, to other UEs, time resource configuration information received from a BS. A signal that is to be transmitted from the UE may be transmitted via a physical layer (e.g., SCI) or via a MAC CE or PC5-RRC signaling.

To transmit and receive signals via SL, a UE needs to determine whether a specific time resource or a specific symbol or slot is a SL resource that can be used for transmitting and receiving a SL signal. A UE may determine a SL resource by using one of the methods 1 through 7 or a combination of one or more of the methods 1 through 7.

Moreover, when some or all of the resources configured by a BS as SL resources are later configured or indicated by the BS as DL resources, a UE may apply one of the following methods or a combination of one or more of the following methods.

Method a-1: When an SFI indicates that one or more symbols in a specific slot configured as a SL resource are used as DL symbols, the entire slot may be used for SL. Thus, the UE may not perform SL transmission and reception in the corresponding slot.

Method a-2: When an SFI indicates that one or more symbols in a specific slot configured as a SL resource are used as DL symbols, the symbols indicated as DL in the corresponding slot may be used for SL. Accordingly, the UE may not perform SL transmission and reception in the symbols indicated as DL in the slot while performing SL transmission and reception in the remaining SL symbols.

Eighth Embodiment

The eighth embodiment provides a method and device for operating, in the process of transmitting and receiving a signal in SL, a mode for transmitting SL data by receiving scheduling information from a BS and a mode for transmitting SL data without scheduling by the BS.

Figure 17A:
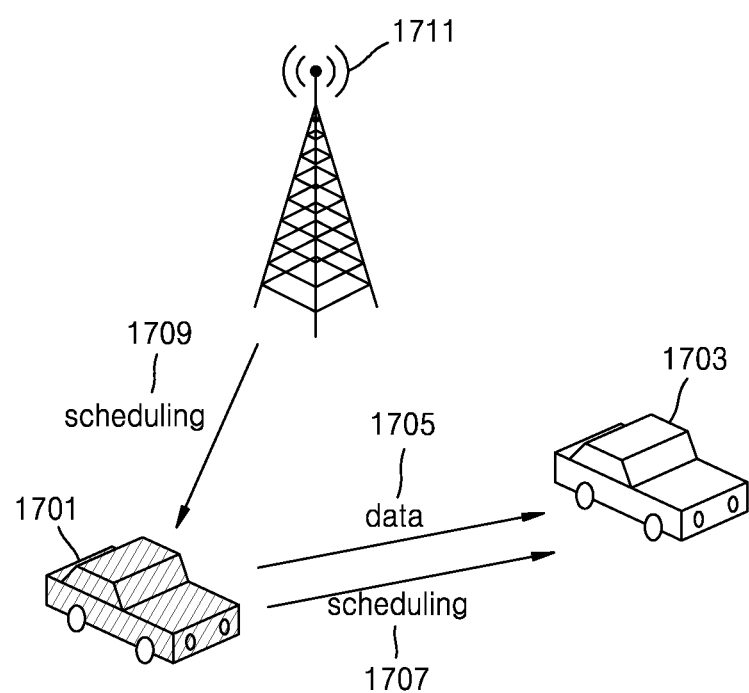
FIG. 17A is a diagram illustrating Mode 1 which is a method, performed by a UE, of transmitting sidelink data to a base station by receiving scheduling information from the base station, according to some embodiments.

FIG. 17A is a diagram illustrating Mode 1 which is a method, performed by a UE, of transmitting SL data to a BS by receiving scheduling information from the BS, according to some embodiments.

In the present disclosure, a method, performed by a UE, of receiving scheduling information from a BS and performing SL communication based on the scheduling information is referred to as Mode 1, but may be referred to as another name.

Referring to FIG. 17A, a UE 1701 that intends to perform transmission in SL may receive scheduling information 1709 for SL communication from a BS 1711. In the present disclosure, the UE 1701 that intends to perform data transmission in SL may be referred to as a transmitting UE, and a UE 1703 that performs data reception in the SL may be referred to as a receiving UE. However, the transmitting UE 1701 and the receiving UE 1703 may each perform both data transmission and reception in the SL. The scheduling information 1709 for SL communication may be obtained by receiving DCI, and the following information may be included in the DCI.

Carrier indicator: This may be used for the purpose of scheduling SL resources on another carrier in a situation in which carrier aggregation (CA) is applied.

Lowest index of sub-channel allocation for initial transmission: This may be used for frequency resource allocation for initial transmission.

Information to be included in SCI

1) Frequency resource allocation information: It may include resource allocation or resource reservation information for initial transmission and retransmission, and subsequent N transmissions.

2) Information about a time gap between initial transmission and retransmission

Information about a SL slot format. It may contain information about which slot and which symbols may be used for SL HARQ-ACK/channel state information (CSI) feedback timing information: It may include timing information for transmitting HARQ-ACK or CSI feedback for SL to a BS.

Recipient ID: ID information about which UEs to receive a transmission.

Quality-of-Service (QOS) information such as priority: information about which priority data is to be transmitted.

The above-described scheduling may be used as scheduling for one SL transmission, and may be used for periodic transmission, semi-persistent scheduling (SPS), or a configured grant. A scheduling method may be distinguished by an indicator included in the DCI or by an RNTI or ID value used to scramble a CRC added to the DCI. Zero bits may be added to make a size of DCI equal to that of other DCI formats such as DCI for DL scheduling or UL scheduling.

The transmitting UE 1701 may receive a DCI for SL scheduling from the base station 1711, transmit a physical SL control channel (PSCCH) including SL scheduling information 1707 to the receiving UE 1703 (1707), and transmit a PSSCH that is data corresponding to the PSCCH to the receiving UE 1703 (1705). The SL scheduling information 1707 may be SCI, and the SCI may include the following information.

HARQ process number: an HARQ process ID for an HARQ-related operation performed on transmitted data.

NDI: information on whether data being currently transmitted is new data

RV: Information about which parity bit is transmitted when mapping data by performing channel coding Layer-1 source ID: physical layer ID information of a transmitting UE Layer-1 destination ID: physical layer ID information of a receiving UE frequency-domain resource assignment for scheduling PSSCH: frequency domain resource configuration information for transmitted data MCS: modulation order and coding rate information QoS indication: It may include a priority, a target latency/delay, a target distance, a target error rate, etc.

Antenna port(s): Antenna port information for data transmission

DMRS sequence initialization: It may include information such as an ID value for initialization of a DMRS sequence.

physical tracking reference signal (PTRS)-DMRS association: It may include information about PTRS mapping.

code block group transmission information (CBGTI): It may be used as an indicator for retransmission in units of CBG.

resource reservation: information for resource reservation

Time gap between initial transmission and retransmission: information about a time gap between initial transmission and retransmission Retransmission index: an indicator identifying retransmission Transmission format/cast type indicator: an indicator for distinguishing a transmission format or unicast/groupcast/broadcast Zone ID: location information of a transmitting UE NACK distance: a reference indicator for determining whether a receiving UE needs to transmit an HARQ ACK/NACK.

HARQ feedback indication: It may include whether an HARQ feedback should be transmitted.

Time-domain resource assignment for scheduling PSSCH: information about a time domain resource for transmitting SL data Second SCI indication: In the case of 2-stage control information, an indicator including mapping information of a second SCI DMRS pattern: DMRS pattern (e.g., a symbol position to which a DMRS is mapped) information The above-described control information may be included in one SCI and transmitted to the receiving UE 1703, or may be included in two SCIs and transmitted thereto. A method of dividing control information into two SCIs for transmission may be referred to as a 2-stage SCI method.

Figure 17B:
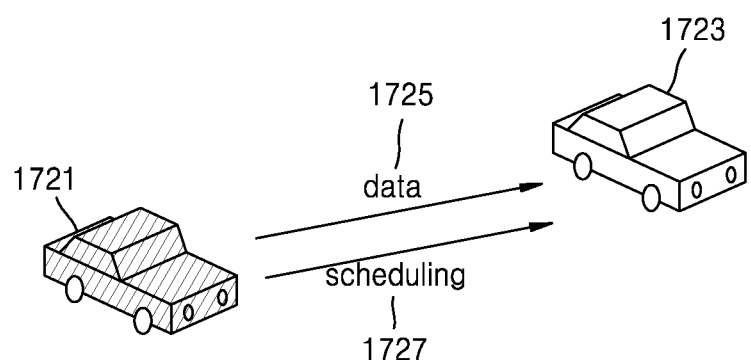
FIG. 17B is a diagram illustrating Mode 2 which is a method, performed by a UE, of transmitting sidelink data to a base station without receiving scheduling information therefrom, according to some embodiments.

FIG. 17B is a diagram illustrating Mode 2 which is a method, performed by a UE, of transmitting SL data to a BS without receiving scheduling information therefrom, according to some embodiments.

In the present disclosure, a method by which a transmitting UE 1721 determines and performs SL communication without receiving scheduling information from a BS is referred to as Mode 2, but may be referred to as another name.

Referring to FIG. 17B, the transmitting UE 1721 may transmit a PSCCH including SL scheduling information 1727 to A receiving UE 1723 and transmit a PSSCH, which is data corresponding to the PSCCH, to the receiving UE 1723 (1725). The SL scheduling information 1727 may include SCI, and the SCI may include the same or similar information to SCI information for Mode 1 described above.

In the present disclosure, DL may refer to a link through which a signal is transmitted from a BS to a UE. In the present disclosure, UL may refer to a link through which a signal is transmitted from a UE to a BS.

Figure 18:
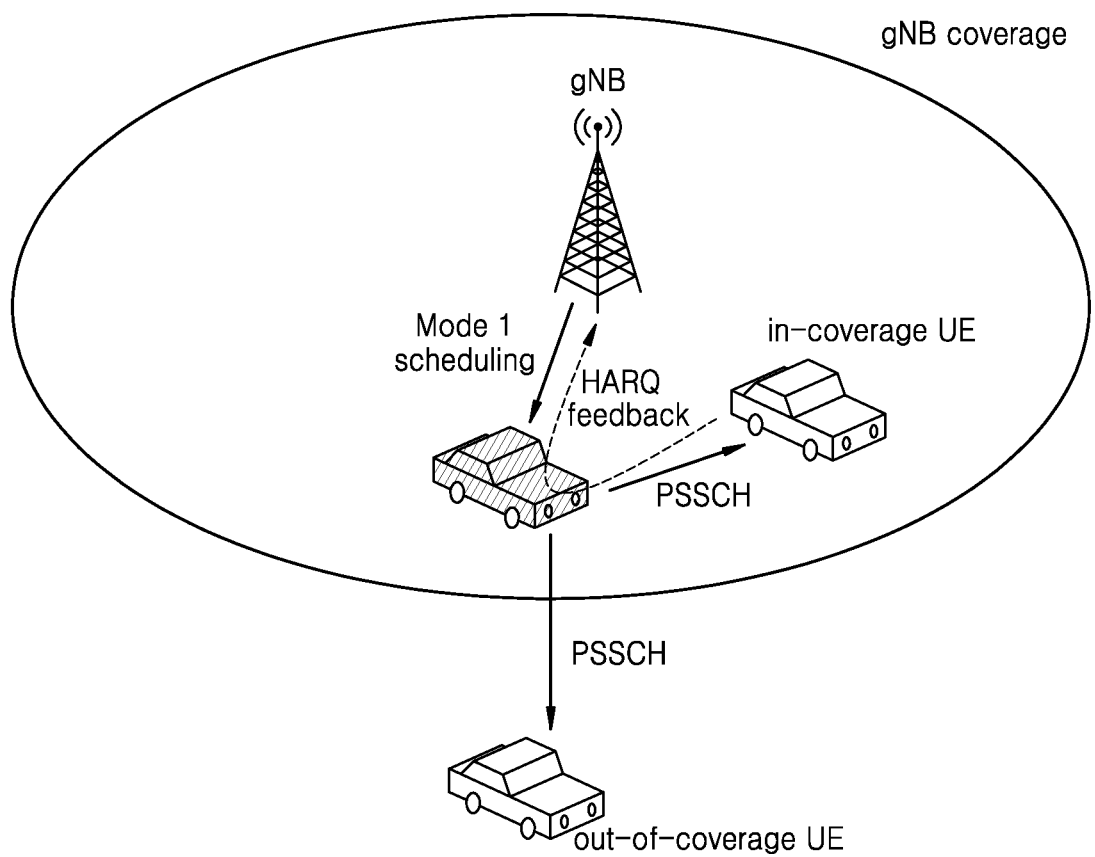
FIG. 18 is a diagram illustrating an example in which a UE operating within coverage of a base station performs sidelink communication with a UE operating out of the coverage of the base station, according to some embodiments.

Mode 1 described above may be a mode for a UE (in-coverage UE) operating within the coverage of a BS (gNB or eNB), and Mode 2 described above may be a mode for a UE (out-of-coverage UE) operating outside the coverage of the BS. As shown in FIG. 18, in order for an in-coverage UE to perform SL communication with an out-of-coverage UE, resource pools of SL, through which the in-coverage UE and the out-of-coverage UE operate, need to match each other. Alternatively, even when transmission resource pools of SL through which the in-coverage UE communicates with the out-of-coverage UE are configured differently from each other, a reception resource pool used by each UE needs to include a transmission resource pool used by the other UE.

Figure 19:
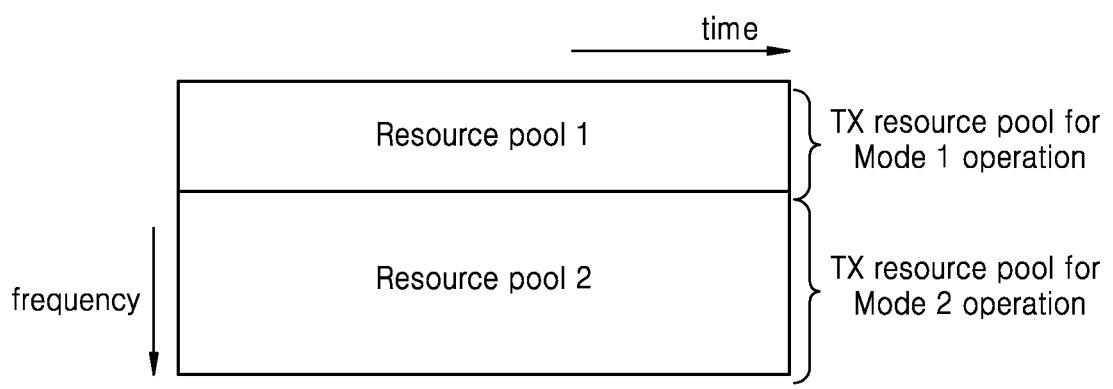
FIG. 19 is a diagram illustrating resources when a transmission resource pool when operating in Mode 1 is configured differently from a transmission resource pool when operating in Mode 2, according to some embodiments.

For example, as illustrated in FIG. 19, a transmission resource pool when operating in the above-described Mode 1 may be configured differently from a transmission resource pool when operating in the above-described Mode 2. When different transmission resource pools are used in Mode 1 and Mode 2, the problem of coexistence between transmitting UEs using Mode 1 and Mode 2 may not occur because different frequency resources are used for transmission in Mode 1 and Mode 2.

However, because the waste of resources may be severe in a configuration in which different transmission resource pools are used in Mode 1 and Mode 2, a case in which the same transmission resource pool is used in Mode 1 and Mode 2 may be considered. When one UE is configured with the same resource pool for Mode 1 and Mode 2, the configured UE may select its own mode between Mode 1 and Mode 2 when transmitting data. In other words, the UE may use resources scheduled by the BS (Mode 1) or use resources selected on its own by performing channel sensing (Mode 2). A UE may select a mode by using one of the following methods or a combination of one or more thereof.

Method 1: A mode is selected according to a state of connection with a BS. That is, the UE may select Mode 1 when it maintains an RRC_connected state with a certain BS, or select Mode 2 and transmit SL data when it is in a state such as an RRC_idle state or inactive state so that it fails to receive scheduling from the BS.

Method 2: When QoS for data to be transmitted is high (that is, when the data to be transmitted has a high priority, it may be considered that the data is assigned a low priority value) so that the data needs to be transmitted preferentially, the UE does not wait for scheduling as in Mode 1 but select a resource to transmit SL data in Mode 2.

Method 3: The UE transmits, to a BS, information about resources that have been used to transmit a SL signal or data after selecting Mode 2 in the past. The SL resources transmitted to the BS may include frequency information, time resource information, and scheduling information (e.g., an MCS, a TBS, etc.).

Method 4: The UE transmits, to a BS, information about resources to be used for transmitting a SL signal or data by selecting Mode 2 in the future. The SL resources transmitted to the BS may include frequency information, time resource information, and scheduling information (e.g., an MCS, a TBS, etc.).

Figure 20:
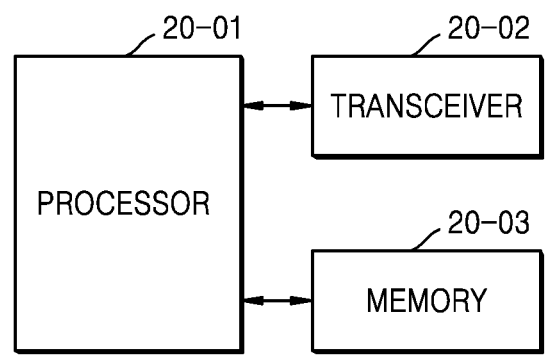
FIG. 20 is a block diagram of a structure of a UE according to some embodiments.
Figure 21:
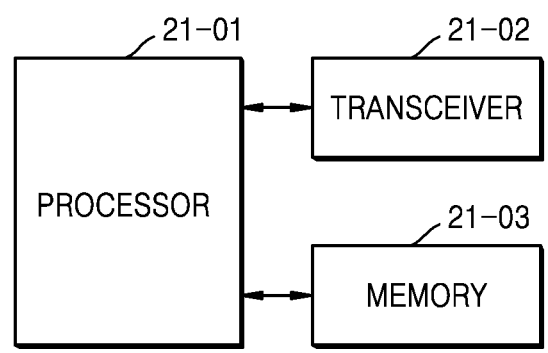
FIG. 21 is a block diagram of a structure of a base station according to some embodiments.

FIGS. 20 and 21 respectively show a transceiver, a processor, and a memory of a UE and their counterparts of a BS for performing operations according to the above-described embodiments of the present disclosure. In the above-described embodiments, transmission and reception methods performed by a BS or UE to transmit a source ID and a destination ID or RNTI for user identification are provided, and in order to perform the transmission and reception methods, a transceiver, a processor, and a memory of the BS and their counterparts of the UE need to operate according to embodiments. In the following operations, a BS may be a UE for performing transmission in SL or a legacy BS. In the following operations, a UE may be a UE for performing transmission or reception in SL.

FIG. 20 is a block diagram of a structure of a UE according to some embodiments.

Referring to FIG. 20, the UE of the present disclosure may include a processor 20-01, a transceiver 20-02, and a memory 20-03. The processor 20-01, the transceiver 20-02, and the memory 20-03 of the UE may operate according to the above-described communication method of the UE. However, the components of the UE are not limited thereto. For example, the UE may include more or fewer components than those described above. Furthermore, the processor 20-01, the transceiver 20-02, and the memory 20-03 may be implemented as a single chip.

The transceiver 20-02 may transmit or receive signals to or from a BS. Here, the signals may include control information and data. To achieve this, the transceiver 20-02 may include an RF transmitter for up-converting and amplifying a frequency of a signal to be transmitted and an RF receiver for low-noise amplifying a received signal and down-converting its frequency. However, this is merely an example of the transceiver 20-02, and components of the transceiver 20-02 are not limited to the RF transmitter and the RF receiver.

Furthermore, the transceiver 20-02 may receive a signal via a radio channel and output the signal to the processor 20-01 and transmit a signal output from the processor 20-01 via a radio channel.

The memory 20-03 may store data and programs necessary for operations of the UE. Furthermore, the memory 20-03 may store control information or data in a signal obtained by the UE. The memory 20-03 may include storage media such as read-only memory (ROM), random access memory (RAM), hard discs, compact disc (CD)-ROM, and digital video discs (DVDs), or a combination thereof.

The processor 20-01 may control a series of processes such that the UE may operate according to the above embodiment of the present disclosure.

FIG. 21 is a block diagram of a structure of a BS according to some embodiments.

Referring to FIG. 21, the BS of the present disclosure may include a processor 21-01, a transceiver 21-02, and a memory 21-03. The processor 21-01, the transceiver 21-02, and the memory 21-03 of the BS may operate according to the above-described communication method of the BS. However, the components of the BS are not limited thereto. For example, the BS may include more or fewer components than those described above. Furthermore, the processor 21-01, the transceiver 21-02, and the memory 21-03 may be implemented as a single chip.

The transceiver 21-02 may transmit or receive signals to or from a UE. The signals may include control information and data. To achieve this, the transceiver 21-02 may include an RF transmitter for up-converting and amplifying a frequency of a signal to be transmitted and an RF receiver for low-noise amplifying a received signal and down-converting its frequency. However, this is merely an example of the transceiver 21-02, and components of the transceiver 21-02 are not limited to the RF transmitter and the RF receiver.

Furthermore, the transceiver 21-02 may receive a signal via a radio channel and output the signal to the processor 21-01 and transmit a signal output from the processor 21-01 via a radio channel.

The memory 21-03 may store data and programs necessary for operations of the BS. Furthermore, the memory 21-03 may store control information or data in a signal obtained by the BS. The memory 21-03 may include storage media such as ROM, RAM, hard discs, CD-ROM, and DVDs, or a combination thereof.

The processor 20-01 may control a series of processes such that the BS may operate according to the above embodiment of the present disclosure.

The methods according to the embodiments of the present disclosure described in the appended claims or specification thereof may be implemented in hardware, software, or a combination of hardware and software.

When the methods are implemented in software, a computer-readable storage medium storing one or more programs (software modules) may be provided. The one or more programs stored in the computer-readable storage medium are configured for execution by one or more processors within an electronic device. The one or more programs include instructions that cause the electronic device to execute the methods according to the embodiments of the present disclosure described in the claims or specification thereof.

These programs (software modules or software) may be stored in RAM, non-volatile memory including a flash memory, ROM, electrically erasable programmable ROM (EEPROM), a magnetic disc storage device, CD-ROM, DVDs or other types of optical storage devices, and a magnetic cassette. Alternatively, the programs may be stored in a memory that is configured as a combination of some or all of the memories. Furthermore, multiple such memories may be included.

Furthermore, the programs may be stored in an attachable storage device that may be accessed through communication networks such as the Internet, Intranet, a local area network (LAN), a wide LAN (WLAN), and a storage area network (SAN), or a communication network configured in a combination thereof. The storage device may access a device for performing operations according to the embodiments of the present disclosure via an external port. Furthermore, a separate storage device on a communication network may also access a device for performing the operations according to the embodiments of the present disclosure.

In the above-described specific embodiments of the present disclosure, a component included in the present disclosure is expressed in a singular or plural form depending on the specific embodiments. However, singular or plural expressions are selected to be suitable for situations presented for convenience of description, and the present disclosure is not limited to the singular or plural form. An element expressed in a plural form may be configured as a single element, or an element expressed in a singular form may be configured as a plurality of elements.

The embodiments of the present disclosure disclosed in the present specification and the accompanying drawings have been provided only as specific examples in order to easily describe technical features in the present disclosure and assist in understanding the present disclosure and are not intended to limit the scope of the present disclosure. In other words, it is obvious to those of ordinary skill in the art that other modifications may be implementable based on the technical spirit of the present disclosure. Furthermore, the embodiments of the present disclosure may be combined with each other for operation when necessary. For example, the first embodiment may be combined with the fourth embodiment for application. Furthermore, embodiments of the present disclosure may be applicable to an LTE system, a 5G system, etc., and other modifications based on the technical spirit of the embodiments may also be implementable.

The invention claimed is:

1. A method, performed by a transmitting device, of transmitting control information in a wireless communication system, the method comprising:
adding cyclic redundancy check (CRC) bits to the control information;
masking the CRC bits, except for first 3 bits of the CRC bits, with an identifier of a receiving user equipment (UE) and an identifier of the transmitting device; and
transmitting the control information to the receiving UE,
wherein the control information includes downlink control information (DCI) or sidelink control information (SCI), and
wherein masking the CRC bits, except for the first 3 bits of the CRC bits, comprises:
masking at least one bit of the CRC bits with the identifier of the receiving UE; and
masking one or more remaining bits, other than the at least one bit of the CRC bits, with a part of the identifier of the transmitting device.

2. The method of claim 1, wherein the CRC bits are 24 bits,
wherein the identifier of the receiving UE is a 16-bit radio network temporary identifier (RNTI) of the receiving UE, and
wherein masking of the CRC bits, except for the first 3 bits of the CRC bits, further comprises:
masking last 16 bits of the CRC bits with the 16-bit RNTI of the receiving UE; and
masking 5 bits that are fourth through eighth bits of the CRC bits with the part of the identifier of the transmitting device.

3. The method of claim 2, wherein the identifier of the transmitting device is a 16-bit RNTI of the transmitting device, and
wherein the part of the identifier of the transmitting device used to mask the 5 bits that are the fourth through eighth bits of the CRC bits is 5 bits of the 16-bit RNTI of the transmitting device.

4. The method of claim 3, wherein the 5 bits of the 16-bit RNTI of the transmitting device are 5 least significant bits (LSBs) or 5 most significant bits (MSBs) of the 16-bit RNTI of the transmitting device.

5. The method of claim 1, wherein masking the at least one bit of the CRC bits with the identifier of the receiving UE comprises masking a plurality of bits of the CRC bits with a part of the identifier of the receiving UE,
wherein the CRC bits are 24 bits,
wherein the identifier of the receiving UE is a 24-bit radio network temporary identifier (RNTI) of the receiving UE,
wherein the masking of the plurality of bits of the CRC bits with the part of the identifier of the receiving UE comprises masking last 21 bits of the CRC bits with last 21 bits or first 21 bits of the 24-bit RNTI of the receiving UE, and
wherein remaining 3 bits, other than the last 21 bits or the first 21 bits of the 24-bit RNTI of the receiving UE used for the masking of the last 21 bits of the CRC bits, are included in a bit field of the control information or a medium access control (MAC) control element (CE) for data scheduled via the control information.

6. A method, performed by a receiving user equipment (UE), of receiving control information in a wireless communication system, the method comprising:
receiving, from a transmitting device, the control information appended with cyclic redundancy check (CRC) bits; and
decoding the control information,
wherein the CRC bits are masked, except for first 3 bits of the CRC bits, with an identifier of the receiving UE and an identifier of the transmitting device,
wherein the control information includes downlink control information (DCI) or sidelink control information (SCI),
wherein at least one bit of the CRC bits, except for the first 3 bits of the CRC bits, is masked with the identifier of the receiving UE, and
wherein one or more remaining bits, other than the at least one bit of the CRC bits, are masked with a part of the identifier of the transmitting device.

7. The method of claim 6, wherein the CRC bits are 24 bits,
wherein the identifier of the receiving UE is a 16-bit radio network temporary identifier (RNTI) of the receiving UE,
wherein last 16 bits of the CRC bits are masked with the 16-bit RNTI of the receiving UE, and
wherein 5 bits that are fourth through eighth bits of the CRC bits are masked with the part of the identifier of the transmitting device.

8. The method of claim 7, wherein the identifier of the transmitting device is a 16-bit RNTI of the transmitting device, and
wherein the part of the identifier of the transmitting device used to mask the 5 bits that are the fourth through eighth bits of the CRC bits is 5 bits of the 16-bit RNTI of the transmitting device.

9. The method of claim 6, wherein the CRC bits are 24 bits,
wherein the at least one bit of the CRC bits that are masked with the identifier of the receiving UE are masked with a part of the identifier of the receiving UE,
wherein the identifier of the receiving UE is a 24-bit radio network temporary identifier (RNTI) of the receiving UE,
wherein last 21 bits of the CRC bits are masked with last 21 bits or first 21 bits of the 24-bit RNTI of the receiving UE, and
wherein remaining 3 bits, other than the 21 bits of the 24-bit RNTI of the receiving UE used for the masking of the last 21 bits of the CRC bits, are included in a bit field of the control information or a medium access control (MAC) control element (CE) for data scheduled via the control information.

10. A transmitting device for transmitting control information in a wireless communication system, the transmitting device comprising:
a transceiver; and
at least one processor connected to the transceiver and configured to:
add cyclic redundancy check (CRC) bits to the control information;
mask the CRC bits, except for first 3 bits of the CRC bits, with an identifier of a receiving user equipment (UE) and an identifier of the transmitting device; and
transmit the control information to the receiving UE, wherein the control information includes downlink control information (DCI) or sidelink control information (SCI), and wherein the at least one processor is configured to mask the CRC bits, except for the first 3 bits of the CRC bits, by:

masking at least one bit of the CRC bits with the identifier of the receiving UE, and masking one or more remaining bits, other than the at least one bit of the CRC bits, with a part of the identifier of the transmitting device.

11. A receiving user equipment (UE) for receiving control information in a wireless communication system, the receiving UE comprising:

a transceiver; and at least one processor connected to the transceiver and configured to:

receive, from a transmitting device, the control information appended with cyclic redundancy check (CRC) bits; and decode the control information, wherein the CRC bits, except for first 3 bits of the CRC bits, are masked with an identifier of the receiving UE and an identifier of the transmitting device, wherein the control information includes downlink control information (DCI) or sidelink control information (SCI), wherein at least one bit of the CRC bits, except for the first 3 bits of the CRC bits, is masked with the identifier of the receiving UE, and wherein one or more remaining bits, other than the at least one bit of the CRC bits, are masked with a part of the identifier of the transmitting device.

* * * * *